United States Patent
Dementyev et al.

(10) Patent No.: US 11,493,661 B2
(45) Date of Patent: Nov. 8, 2022

(54) DOWNHOLE NMR SYSTEM

(71) Applicant: Schlumberger Technology Corporation, Sugar Land, TX (US)

(72) Inventors: Anatoly Dementyev, Sugar Land, TX (US); Nicholas Heaton, Sugar Land, TX (US); Krishnamurthy Ganesan, Sugar Land, TX (US); Henry Bachman, Sugar Land, TX (US)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 145 days.

(21) Appl. No.: 16/569,689

(22) Filed: Sep. 13, 2019

(65) Prior Publication Data

US 2020/0088904 A1    Mar. 19, 2020

Related U.S. Application Data

(60) Provisional application No. 62/730,564, filed on Sep. 13, 2018.

(51) Int. Cl.
*G01V 3/32* (2006.01)
*E21B 49/00* (2006.01)
*E21B 47/07* (2012.01)

(52) U.S. Cl.
CPC .............. *G01V 3/32* (2013.01); *E21B 47/07* (2020.05); *E21B 49/00* (2013.01); *E21B 49/003* (2013.01)

(58) Field of Classification Search
None
See application file for complete search history.

(56) References Cited

U.S. PATENT DOCUMENTS

| | | | |
|---|---|---|---|
| 5,023,551 A | 6/1991 | Kleinberg et al. | |
| 6,246,236 B1 | 6/2001 | Poitzsch et al. | |
| 6,624,629 B1* | 9/2003 | Speier | G01V 3/32 324/303 |
| 10,669,834 B2* | 6/2020 | Dykstra | E21B 3/02 |
| 2004/0263164 A1* | 12/2004 | Kurimoto | G01R 33/583 324/307 |
| 2007/0075706 A1* | 4/2007 | Chen | G01V 3/30 324/303 |
| 2018/0372907 A1* | 12/2018 | Dykstra | G01V 3/14 |
| 2019/0049615 A1* | 2/2019 | Li | G01R 33/3804 |

FOREIGN PATENT DOCUMENTS

WO      2018063246 A1    4/2018

OTHER PUBLICATIONS

European Search Report of EP application 19197194.4 emailed Feb. 14, 2020 (11 pages).

* cited by examiner

*Primary Examiner* — Douglas X Rodriguez
(74) *Attorney, Agent, or Firm* — Jeffrey D. Frantz

(57) ABSTRACT

A method can include triggering an assessment of pulse width of an X degree pulse of a downhole NMR tool; responsive to the assessment, determining an optimal pulse width of the X degree pulse; acquiring NMR measurements using the downhole NMR tool and the optimal pulse width; and characterizing a formation using at least a portion of the NMR measurements.

11 Claims, 20 Drawing Sheets

Method 800

DOWNHOLE NMR SYSTEM

RELATED APPLICATIONS

This application claims priority to and the benefit of a U.S. Provisional Application having Ser. No. 62/730,564, filed 13 Sep. 2018, which is incorporated by reference herein.

BACKGROUND

Various types of sensors may be included in one or more types of downhole tools to perform measurements where such measurements can be utilized to determine properties of objects, substances or objects and substances. For example, an object can be a formation that includes one or more substances, which may be present in one or more forms. As an example, as to nuclear magnetic resonance (NMR) measurements, a substance can include protons (e.g., $^1$H), which can be aligned using a static magnetic field and altered using an oscillating magnetic field. Responses of the protons to alteration can be acquired as signals, which can be processed to determine properties such as relaxation properties.

Relaxation pertains to restoration of a state, which may be an equilibrium state, or otherwise going back to a low-energy level after excitation. One relaxation property is spin-lattice (longitudinal) or $T_1$ relaxation, which is a process by which longitudinal magnetization is recovered (e.g., after an excitation pulse is applied) due to transfer of energy from a nuclear spin system to neighboring molecules (e.g., the lattice). The $T_1$ relaxation time (or simply $T_1$) is a measure of the rate of transfer of energy from the nuclear spin system to the neighboring molecules (e.g., the lattice). $T_1$ can be defined as the time when approximately 63 percent of the longitudinal magnetization has recovered. Another relaxation property is spin-spin (transverse) or $T_2$ relaxation, which is a process by which transverse magnetization decays due to dephasing of proton spins (e.g., spins becoming desynchronized). Responsive to application of an excitation pulse, magnetization can be altered by 90 degrees from a longitudinal axis (e.g., z-axis) into a plane (e.g., x, y-plane). The transverse magnetization can be initially at a maximum (e.g., due to coherent nuclear spins); however, coherence gradually diminishes due to field inhomogeneities and/or direct interactions between the spins (e.g., without energy transfer to the lattice). $T_2$ relaxation occurs in the plane and may be depicted as the spreading of magnetic moments along the plane (e.g., some faster and some slower). The $T_2$ relaxation time (or simply $T_2$) is a measure of the rate of the decay of transverse magnetization within the plane. $T_2$ can be defined as the time when approximately 63 percent of the transverse magnetization has decayed.

While NMR measurements are given as an example, one or more other types of measurements may be performed using a downhole tool in a downhole environment (e.g., a downhole tool disposed in a borehole, etc.).

SUMMARY

A method can include triggering an assessment of pulse width of an X degree pulse of a downhole NMR tool; responsive to the assessment, determining an optimal pulse width of the X degree pulse; acquiring NMR measurements using the downhole NMR tool and the optimal pulse width; and characterizing a formation using at least a portion of the NMR measurements. A downhole NMR tool can include a processor; memory accessibly by the processor; processor-executable instructions stored in the memory and executable by the processor to: trigger an assessment of pulse width of an X degree pulse; responsive to the assessment, determine an optimal pulse width of the X degree pulse; and acquire NMR measurements using the optimal pulse width. One or more computer-readable storage media can include computer-executable instructions executable to instruct a computing system to: trigger an assessment of pulse width of an X degree pulse of a downhole NMR tool; responsive to the assessment, determine an optimal pulse width of the X degree pulse; and acquire NMR measurements using the downhole NMR tool and the optimal pulse width. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
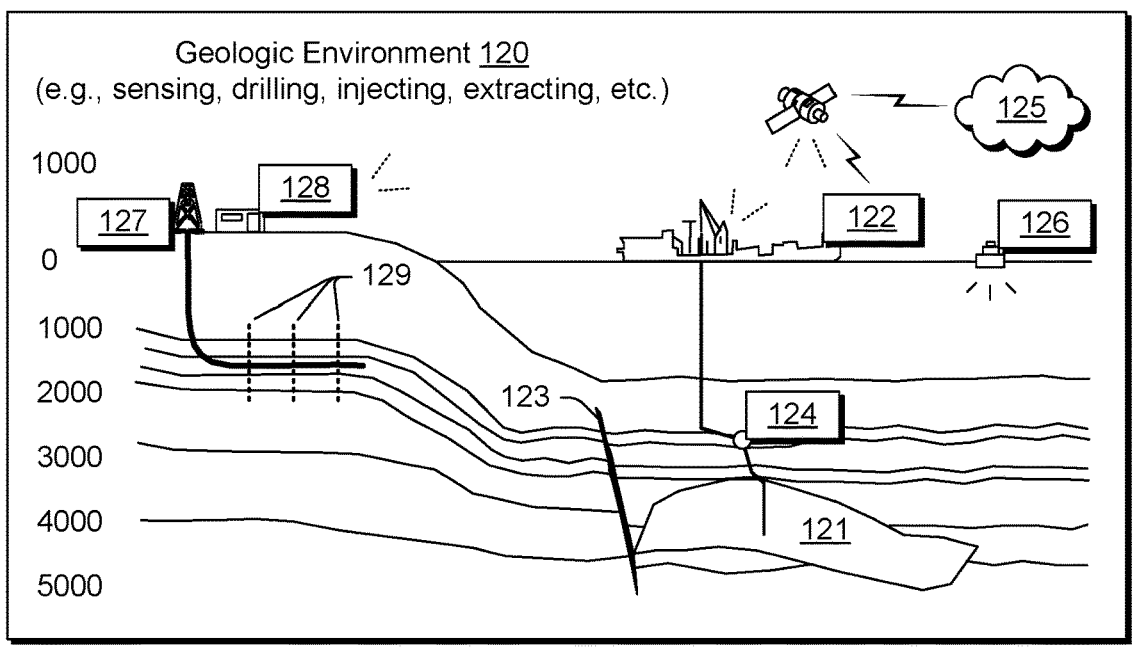
FIG. 1 illustrates examples of equipment in a geologic environment.
Figure 1:
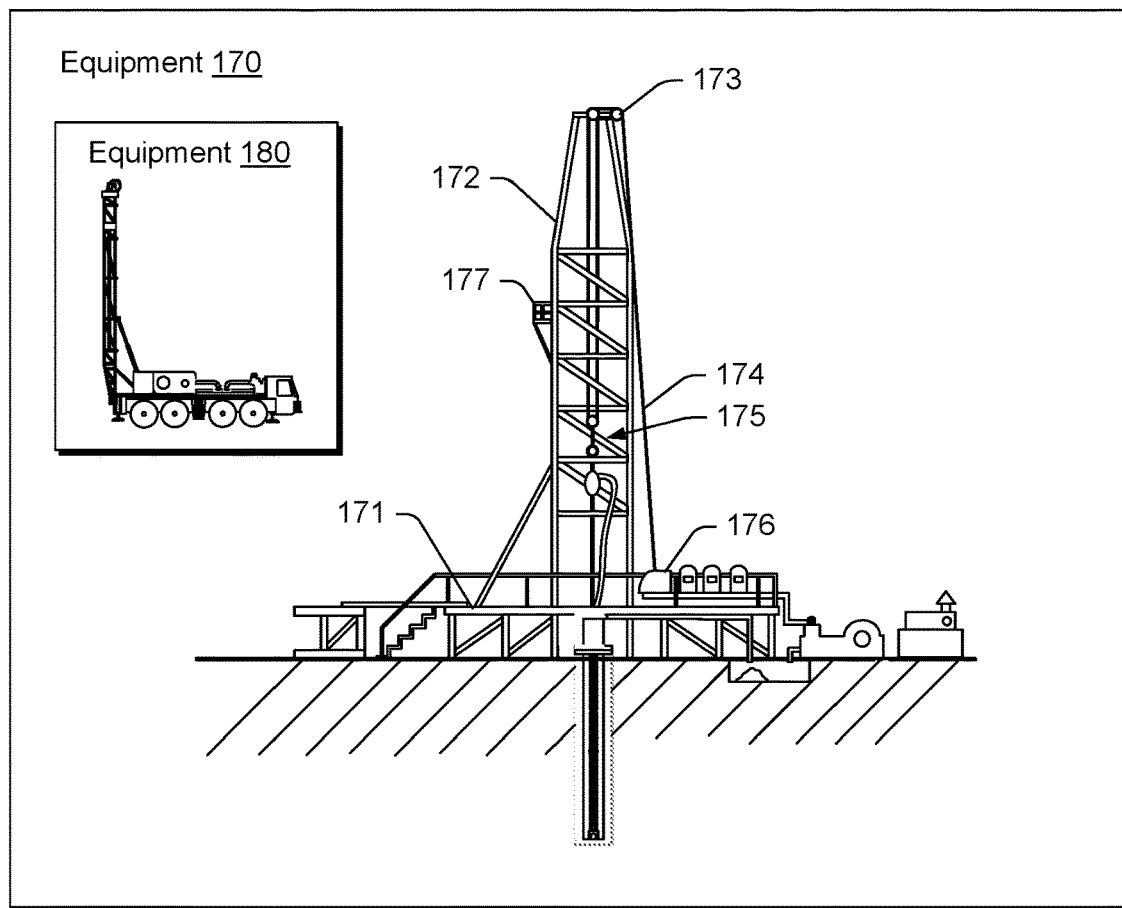

The following description includes embodiments of the best mode presently contemplated for practicing the described implementations. This description is not to be taken in a limiting sense, but rather is made merely for the purpose of describing the general principles of the implementations. The scope of the described implementations should be ascertained with reference to the issued claims.

Various operations can be performed in a field. For example, consider exploration as an initial phase in petroleum operations that includes generation of a prospect or play or both, and drilling of an exploration well or borehole. Appraisal, development and production phases may follow successful exploration.

A borehole may be referred to as a wellbore and can include an openhole portion or an uncased portion and/or may include a cased portion. A borehole may be defined by a bore wall that is composed of a rock that bounds the borehole.

As to a well or a borehole, whether for one or more of exploration, sensing, production, injection or other operation(s), it can be planned. Such a process may be referred to generally as well planning, a process by which a path can be mapped in a geologic environment. Such a path may be referred to as a trajectory, which can include coordinates in a three-dimensional coordinate system where a measure along the trajectory may be a measured depth, a total vertical depth or another type of measure. During drilling, wireline investigations, etc., equipment may be moved into and/or out of a well or borehole. Such operations can occur over time and may differ with respect to time. As an example, drilling can include using one or more logging tools that can perform one or more logging operations while drilling or otherwise with a drillstring (e.g., while stationary, while tripping in, tripping out, etc.). As an example, a wireline operation can include using one or more logging tools that can perform one or more logging operations. A planning process may call for performing various operations, which may be serial, parallel, serial and parallel, etc.

As an example, a well plan can be generated based at least in part on imposed constraints and known information. As an example, a well plan may be provided to a well owner, approved, and then implemented by a drilling service provider (e.g., a directional driller or "DD"). In such an example, a rig may be used to drill, for example, according to a well plan. During a period of time during which a well plan is implemented, a rig may transition from one state to another state, which may be referred to as rigstates. As an example, a state may be a drilling state or may be a state where drilling into a formation (e.g., rock) is not occurring (e.g., an idle state, a tripping-in state, a tripping-out state, etc.).

As an example, a well design system can account for one or more capabilities of a drilling system or drilling systems that may be utilized at a wellsite. As an example, a drilling engineer may be called upon to take such capabilities into account, for example, as one or more of various designs and specifications are created. As an example, a state such as a rigstate may correspond to a capability, for example, while the capability is being utilized.

As an example, a well design system, which may be a well planning system, may take into account automation. For example, where a wellsite includes wellsite equipment that can be automated, for example, via a local and/or a remote automation command, a well plan may be generated in digital form that can be utilized in a well drilling system where at least some amount of automation is possible and desired. For example, a digital well plan can be accessible by a well drilling system where information in the digital well plan can be utilized via one or more automation mechanisms of the well drilling system to automate one or more operations at a wellsite.

As an example, drilling or one or more other operations may occur responsive to measurements. For example, a logging while drilling operation may acquire measurements and adjust drilling based at least in part on such measurements. As an example, a logging operation can include moving a logging tool, stopping a logging tool, or otherwise controlling a logging tool based at least in part on measurements acquired by the logging tool or, for example, another logging tool (e.g., sensor unit, etc.).

As explained, a nuclear magnetic resonance (NMR) can be utilized to determine properties of objects, substances or objects and substances. In various operations, a downhole tool can include one or more NMR units that can acquire NMR measurements. Such measurements may provide for characterization of one or more objects, one or more substances, etc. Such measurements may be acquired using wireline technology, drilling technology (e.g., logging while drilling, etc.), or other downhole technology. As an example, NMR technology can be utilized in a geologic environment to characterize the geologic environment (e.g., formation characterization, fluid characterization, etc.).

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with a variety of sensors, detectors, actuators, etc. For example, equipment 122 may include communication circuitry to receive and/or to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, geolocation, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, NMR logging, assessment of one or more fractures, injection, production, etc. As an example, the equipment 127 and/or 128 may provide for measurement, collection, communication, storage, analysis, etc. of data such as, for example, formation data, fluid data, production data (e.g., for one or more produced resources), etc. As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system. As shown in FIG. 1, the equipment 180 can be mobile as carried by a vehicle; noting that the equipment 170 can be assembled, disassembled, transported and re-assembled, etc.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrick person may be a rig crew member that works on a platform attached to a derrick or a mast. A derrick can include a landing on which a derrick person may stand. As an example, such a landing may be about 10 meters or more above a rig floor. In an operation referred to as trip out of the hole (TOH), a derrick person may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrick person controls the machinery rather than physically handling the pipe.

As an example, a trip may refer to the act of pulling equipment from a bore (e.g., pulling out of hole or POOH) and/or placing equipment in a bore (e.g., running in hole or RIH). As an example, equipment may include a drillstring that can be pulled out of the hole and/or placed or replaced in the hole. As an example, a pipe trip may be performed where a drill bit has dulled or has otherwise ceased to drill efficiently and is to be replaced.

Figure 2:
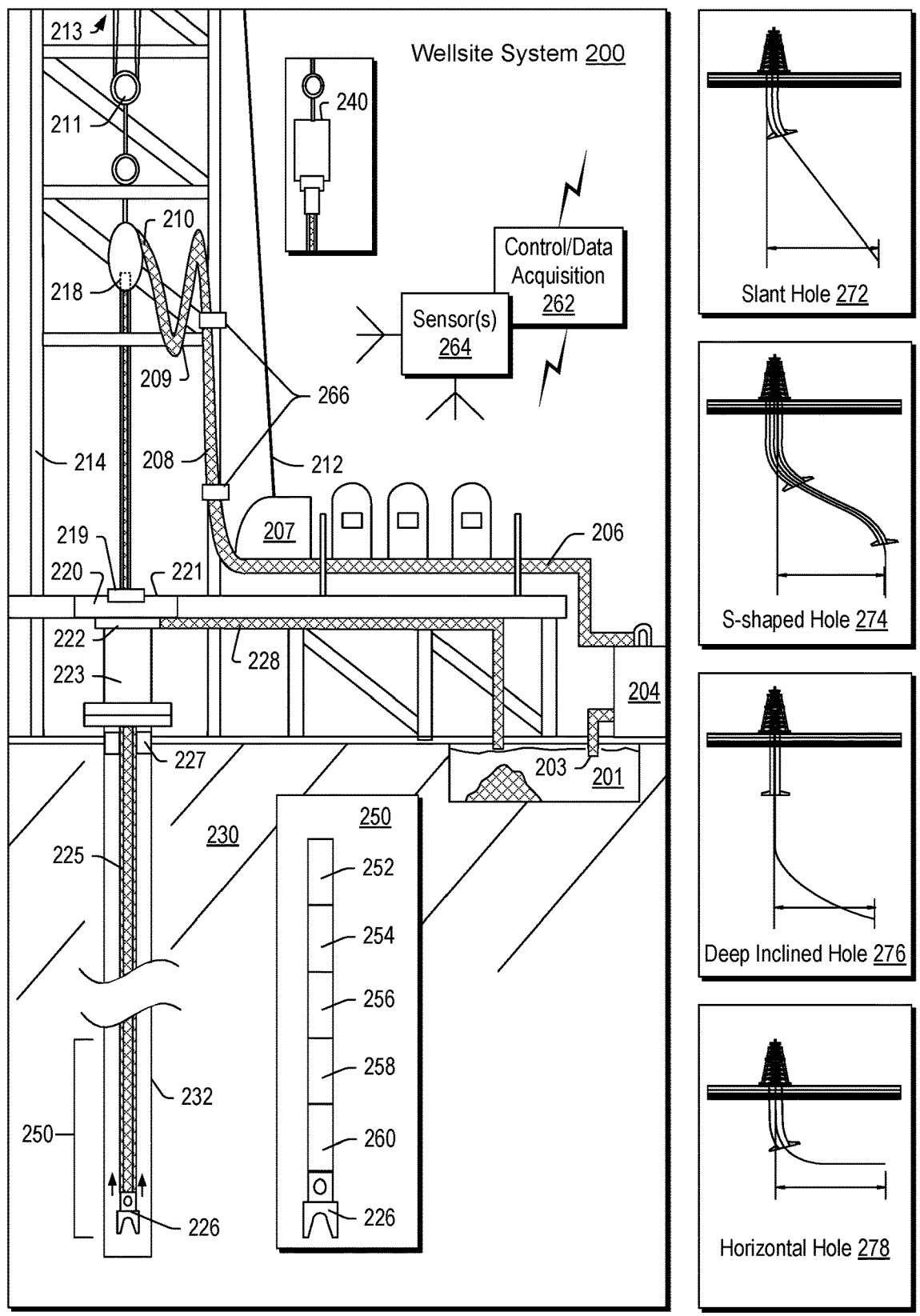
FIG. 2 illustrates an example of a system and examples of types of holes.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid that may help to transport cuttings, etc.), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling or one or more other types of drilling. As an example, drilling can include one or more of rotating and sliding.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 215 and the derrick 214 positioned over the borehole 232. As mentioned, the wellsite system 200 can include the rotary table 220 where the drillstring 225 passes through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drillstring 225 may be pulled from a wellbore and optionally replaced, for example, with a new or sharpened drill bit, a smaller diameter drillstring, etc. As mentioned, the act of pulling a drillstring out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drillstring 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more components of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measurement-while-drilling (MWD) module 256, an optional module 258, a rotary-steerable system (RSS) and/or motor 260, and the drill bit 226. Such components or modules may be referred to as tools where a drillstring can include a plurality of tools.

As to a RSS, it involves technology utilized for direction drilling. Directional drilling involves drilling into the Earth to form a deviated bore such that the trajectory of the bore is not vertical; rather, the trajectory deviates from vertical along one or more portions of the bore. As an example, consider a target that is located at a lateral distance from a surface location where a rig may be stationed. In such an example, drilling can commence with a vertical portion and then deviate from vertical such that the bore is aimed at the target and, eventually, reaches the target. Directional drilling may be implemented where a target may be inaccessible from a vertical location at the surface of the Earth, where material exists in the Earth that may impede drilling or otherwise be detrimental (e.g., consider a salt dome, etc.), where a formation is laterally extensive (e.g., consider a relatively thin yet laterally extensive reservoir), where multiple bores are to be drilled from a single surface bore, where a relief well is desired, etc.

One approach to directional drilling involves a mud motor; however, a mud motor can present some challenges depending on factors such as rate of penetration (ROP), transferring weight to a bit (e.g., weight on bit, WOB) due to friction, etc. A mud motor can be a positive displacement motor (PDM) that operates to drive a bit during directional drilling. A PDM operates as drilling fluid is pumped through it where the PDM converts hydraulic power of the drilling fluid into mechanical power to cause the bit to rotate. A PDM can operate in a so-called sliding mode, when the drillstring is not rotated from the surface. As an example, a PDM may operate in a sliding and rotating mode where the PDM is driven by the flow of drilling fluid and where rotation of a drillstring occurs via surface equipment (e.g., a rotary table or a top drive).

A RSS can drill directionally where there is continuous rotation from surface equipment, which can alleviate the sliding of a steerable motor (e.g., a PDM). A RSS may be deployed when drilling directionally (e.g., deviated, horizontal, or extended-reach wells). A RSS can aim to minimize interaction with a borehole wall, which can help to preserve borehole quality. A RSS can aim to exert a relatively consistent side force akin to stabilizers that rotate with the drillstring or orient the bit in the desired direction while continuously rotating at the same number of rotations per minute as the drillstring.

The LWD module 254 may be housed in a suitable type of drill collar and can contain one or a plurality of selected types of logging tools (e.g., NMR unit or units, etc.). It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device, a NMR measuring device, etc.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

As an example, one or more NMR measuring devices (e.g., NMR units, etc.) may be included in a drillstring (e.g., a BHA, etc.) where, for example, measurements may support one or more of geosteering, geostopping, trajectory optimization, etc. As an example, motion characterization data can be utilized for control of NMR measurements (e.g., acquisition, processing, quality assessment, etc.).

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees. As an example, a trajectory and/or a drillstring may be characterized in part by a dogleg severity (DLS), which can be a two-dimensional parameter specified in degrees per 30 meters (e.g., or degrees per 100 feet).

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform method such as geosteering. As mentioned, a steerable system can be or include an RSS. As an example, a steerable system can include a PDM or a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; a combinable magnetic resonance (CMR) tool for measuring properties (e.g., relaxation properties, etc.); one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium. As an example, data acquired by a NMR unit may be processed in a manner that can reduce data load, which can facilitate transmission. For example, consider downhole processing of NMR measurements to reduce a total number of bits to be transmitted (e.g., consider downhole data compression, downhole data analysis, etc.).

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG framework (Schlumberger Limited, Houston, Tex.). As an example, the TECHLOG framework can be interoperable with one or more other frameworks such as, for example, the PETREL framework (Schlumberger Limited, Houston, Tex.) and/or the DELFI framework (Schlumberger Limited, Houston, Tex.).

Figure 3:
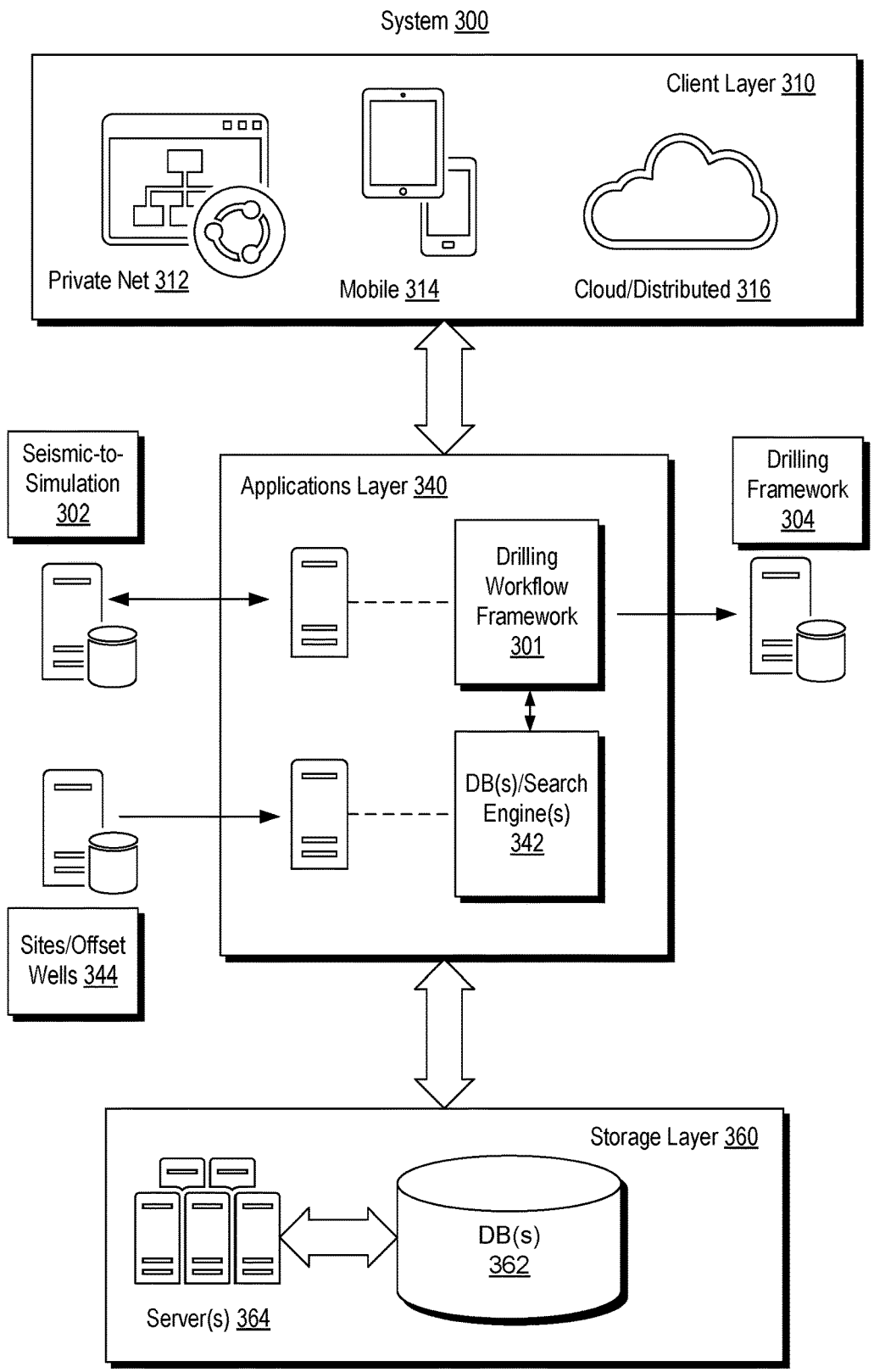
FIG. 3 illustrates an example of a system.

FIG. 3 shows an example of a system 300 that includes a drilling workflow framework 301, a seismic-to-simulation framework 302, a drilling framework 304, a client layer 310, an applications layer 340 and a storage layer 360. As shown the client layer 310 can be in communication with the applications layer 340 and the applications layer 340 can be in communication with the storage layer 360. In such an example, a computational framework may be provided for handling of logging measurements and/or data derived from logging measurements. For example, logging information may be provided to the seismic-to-simulation framework 302 and/or to the drilling framework 304. Such information may be utilized for model building (e.g., constructing a multidimensional model of a geologic environment), generating a trajectory for a well (e.g., or an extension thereof), generating a stimulation plan (e.g., fracturing, chemical treatment, etc.), controlling one or more drilling operations, etc.

In the example of FIG. 3, the client layer 310 can include features that allow for access and interactions via one or more private networks 312, one or more mobile platforms and/or mobile networks 314 and via the "cloud" 316, which may be considered to include distributed equipment that forms a network such as a network of networks.

In the example of FIG. 3, the applications layer 340 includes the drilling workflow framework 301. The applications layer 340 also includes a database management component 342 that includes one or more search engine features (e.g., sets of executable instructions to perform various actions, etc.).

As an example, the database management component 342 can include one or more search engine features that provide for searching one or more information that may be stored in one or more data repositories. As an example, the STUDIO E&P knowledge environment (Schlumberger Ltd., Houston, Tex.) includes STUDIO FIND search functionality, which provides a search engine. The STUDIO FIND search functionality also provides for indexing content, for example, to create one or more indexes. As an example, search functionality may provide for access to public content, private content or both, which may exist in one or more databases, for example, optionally distributed and accessible via an intranet, the Internet or one or more other networks. As an example, a search engine may be configured to apply one or more filters from a set or sets of filters, for example, to enable users to filter out data that may not be of interest.

As an example, a framework may provide for interaction with a search engine and, for example, associated features such as features of the STUDIO FIND search functionality. As an example, a framework may provide for implementation of one or more spatial filters (e.g., based on an area viewed on a display, static data, etc.). As an example, a search may provide access to dynamic data (e.g., "live" data from one or more sources), which may be available via one or more networks (e.g., wired, wireless, etc.). As an example, one or more components may optionally be implemented within a framework or, for example, in a manner operatively coupled to a framework (e.g., as an add-on, a plug-in, etc.). As an example, a component for structuring search results (e.g., in a list, a hierarchical tree structure, etc.) may optionally be implemented within a framework or, for example, in a manner operatively coupled to a framework (e.g., as an add-on, a plug-in, etc.).

In the example of FIG. 3, the applications layer 340 can include communicating with one or more resources such as, for example, the seismic-to-simulation framework 302, the drilling framework 304 and/or one or more sites, which may be or include one or more offset wellsites. As an example, the applications layer 340 may be implemented for a particular wellsite where information can be processed as part of a workflow for operations such as, for example, operations performed, being performed and/or to be performed at the particular wellsite. As an example, an operation may involve directional drilling, for example, via geosteering. As an example, an operation may involve logging via one or more downhole tools.

In the example of FIG. 3, the storage layer 360 can include various types of data, information, etc., which may be stored in one or more databases 362. As an example, one or more servers 364 may provide for management, access, etc., to data, information, etc., stored in the one or more databases 462. As an example, the database management component 342 may provide for searching as to data, information, etc., stored in the one or more databases 362.

As an example, the database management component 342 may include features for indexing, etc. As an example, information may be indexed at least in part with respect to wellsite. For example, where the applications layer 440 is implemented to perform one or more workflows associated with a particular wellsite, data, information, etc., associated with that particular wellsite may be indexed based at least in part on the wellsite being an index parameter (e.g., a search parameter).

As an example, the system 300 of FIG. 3 may be implemented to perform one or more portions of one or more workflows associated with the system 200 of FIG. 2. As an example, the drilling workflow framework 301 may interact with a technical data framework (e.g., a logging data framework, etc.) and the drilling framework 304 before, during and/or after performance of one or more drilling operations. In such an example, the one or more drilling operations may be performed in a geologic environment (see, e.g., the environment 150 of FIG. 1) using one or more types of equipment (see, e.g., equipment of FIGS. 1 and 2).

As an example, an architecture utilized in a system such as, for example, the system 300 may include features of the AZURE architecture (Microsoft Corporation, Redmond, Wash.). As an example, a cloud portal block can include one or more features of an AZURE portal that can manage, mediate, etc. access to one or more services, data, connections, networks, devices, etc. As an example, the system 300 may include features of the GOOGLE cloud architecture (Google, Mountain View, Calif.).

As an example, the system 300 can include a cloud computing platform and infrastructure, for example, for building, deploying, and managing applications and services (e.g., through a network of datacenters, etc.). As an example, such a cloud platform may provide PaaS and IaaS services and support one or more different programming languages, tools and frameworks, etc.

Figure 4:
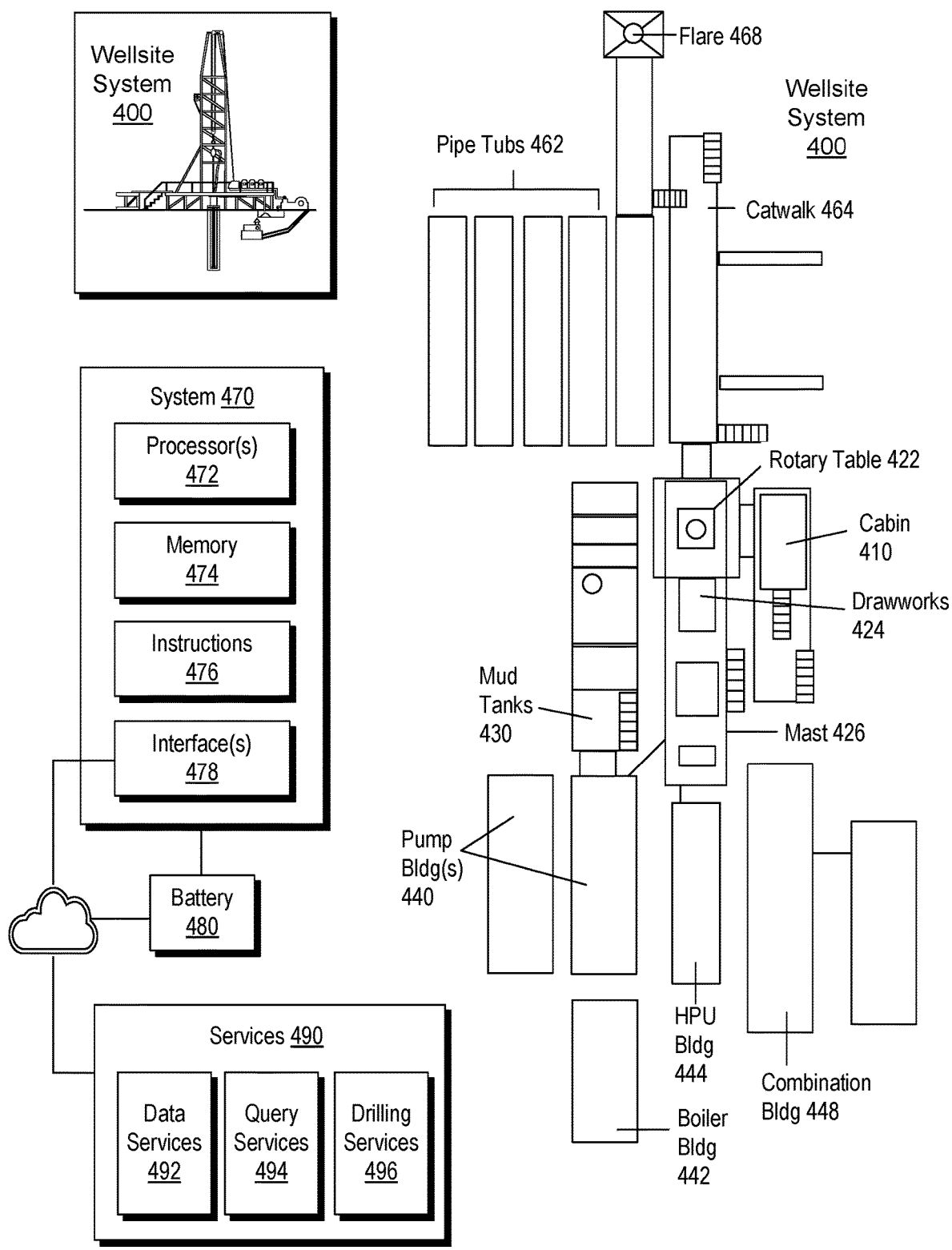
FIG. 4 illustrates an example of a system.

FIG. 4 shows an example of a wellsite system 400, specifically, FIG. 4 shows the wellsite system 400 in an approximate side view and an approximate plan view along with a block diagram of a system 470.

In the example of FIG. 4, the wellsite system 400 can include a cabin 410, a rotary table 422, drawworks 424, a mast 426 (e.g., optionally carrying a top drive, etc.), mud tanks 430 (e.g., with one or more pumps, one or more shakers, etc.), one or more pump buildings 440, a boiler building 442, a hydraulic pumping units (HPU) building 444 (e.g., with a rig fuel tank, etc.), a combination building 448 (e.g., with one or more generators, etc.), pipe tubs 462, a catwalk 464, a flare 468, etc. Such equipment can include one or more associated functions and/or one or more associated operational risks, which may be risks as to time, resources, and/or humans.

A wellsite can include a prime mover as a source of power. As an example, a prime mover can include one to four or more diesel engines, which may produce several thousand horsepower. Such engines can be operatively coupled to one or more electric generators. Electrical power may be distributed by a silicon-controlled-rectifier (SCR) system. Rigs that convert diesel power to electricity may be referred to as electric rigs or diesel electric rigs. As an example, a rig can be configured for transmission of power from one or more diesel engines to one or more rig components (e.g., drawworks, pumps, rotary table, etc.) through mechanical belts, chains, clutches, etc. Such a configuration may be referred to a mechanical rig or a so-called "power rig".

As shown in the example of FIG. 4, the wellsite system 400 can include a system 470 that includes one or more processors 472, memory 474 operatively coupled to at least one of the one or more processors 472, instructions 476 that can be, for example, stored in the memory 474, and one or more interfaces 478. As an example, the system 470 can include one or more processor-readable media that include processor-executable instructions executable by at least one of the one or more processors 472 to cause the system 470 to control one or more aspects of the wellsite system 400. In such an example, the memory 474 can be or include the one or more processor-readable media where the processor-executable instructions can be or include instructions. As an example, a processor-readable medium can be a computer-readable storage medium that is not a signal and that is not a carrier wave.

FIG. 4 also shows a battery 480 that may be operatively coupled to the system 470, for example, to power the system 470. As an example, the battery 480 may be a back-up battery that operates when another power supply is unavailable for powering the system 470. As an example, the battery 480 may be operatively coupled to a network, which may be a cloud network. As an example, the battery 480 can include smart battery circuitry and may be operatively coupled to one or more pieces of equipment via a system management bus (SMBus) or other type of bus.

In the example of FIG. 4, services 490 are shown as being available, for example, via a cloud platform. Such services can include data services 492, query services 494 and drilling services 496. As an example, the services 490 may be part of a system such as the system 300 of FIG. 3.

As an example, a system such as, for example, the system 300 of FIG. 3 may be utilized to perform a workflow. Such a system may be distributed and allow for collaborative workflow interactions and may be considered to be a platform (e.g., a framework for collaborative interactions, etc.).

As an example, a workflow can commence with an evaluation stage, which may include a geological service provider evaluating a formation. As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory, which may involve execution of one or more G&G software packages. Examples of such software packages include the PETREL framework. As an example, a system or systems may utilize a framework such as the DELFI framework. Such a framework may operatively couple various other frameworks to provide for a multi-framework workspace.

As an example, a G&G service provider may determine a well trajectory or a section thereof, based on, for example, one or more model(s) provided by a formation evaluation, and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

Figure 5:
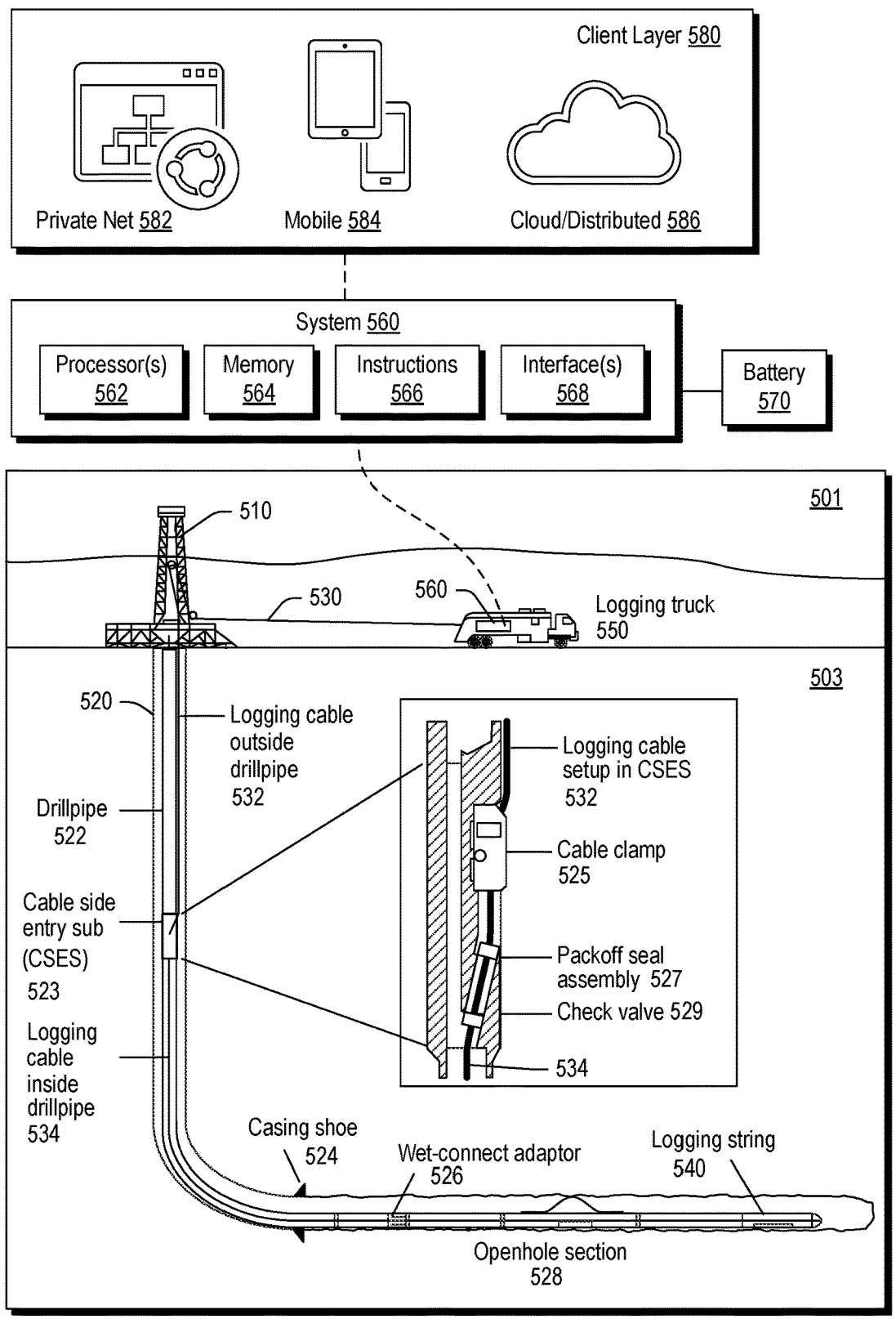
FIG. 5 illustrates an example of a system.

FIG. 5 shows an example of an environment 501 that includes a subterranean portion 503 where a rig 510 is positioned at a surface location above a bore 520. In the example of FIG. 5, various wirelines services equipment can be operated to perform one or more wirelines services including, for example, acquisition of data from one or more positions within the bore 520.

In the example of FIG. 5, the bore 520 includes drillpipe 522, a casing shoe, a cable side entry sub (CSES) 523, a wet-connector adaptor 526 and an openhole section 528. As an example, the bore 520 can be a vertical bore or a deviated bore where one or more portions of the bore may be vertical and one or more portions of the bore may be deviated, including substantially horizontal.

In the example of FIG. 5, the CSES 523 includes a cable clamp 525, a packoff seal assembly 527 and a check valve 529. These components can provide for insertion of a logging cable 530 that includes a portion 532 that runs outside the drillpipe 522 to be inserted into the drillpipe 522 such that at least a portion 534 of the logging cable runs inside the drillpipe 522. In the example of FIG. 5, the logging cable 530 runs past the wet-connect adaptor 526 and into the openhole section 528 to a logging string 540.

As shown in the example of FIG. 5, a logging truck 550 (e.g., a wirelines services vehicle) can deploy the wireline 530 under control of a system 560. As shown in the example of FIG. 5, the system 560 can include one or more processors 562, memory 564 operatively coupled to at least one of the one or more processors 562, instructions 566 that can be, for example, stored in the memory 564, and one or more interfaces 568. As an example, the system 560 can include one or more processor-readable media that include processor-executable instructions executable by at least one of the one or more processors 562 to cause the system 560 to control one or more aspects of equipment of the logging string 540 and/or the logging truck 550. In such an example, the memory 564 can be or include the one or more processor-readable media where the processor-executable instructions can be or include instructions. As an example, a processor-readable medium can be a computer-readable storage medium that is not a signal and that is not a carrier wave.

FIG. 5 also shows a battery 570 that may be operatively coupled to the system 560, for example, to power the system 560. As an example, the battery 570 may be a back-up battery that operates when another power supply is unavailable for powering the system 560 (e.g., via a generator of the wirelines truck 550, a separate generator, a power line, etc.). As an example, the battery 570 may be operatively coupled to a network, which may be a cloud network. As an example, the battery 570 can include smart battery circuitry and may be operatively coupled to one or more pieces of equipment via a SMBus or other type of bus.

As an example, the system 560 can be operatively coupled to a client layer 580. In the example of FIG. 5, the client layer 580 can include features that allow for access and interactions via one or more private networks 582, one or more mobile platforms and/or mobile networks 584 and via the "cloud" 586, which may be considered to include distributed equipment that forms a network such as a network of networks. As an example, the system 560 can include circuitry to establish a plurality of connections (e.g., sessions). As an example, connections may be via one or more types of networks. As an example, connections may be client-server types of connections where the system 560 operates as a server in a client-server architecture. For example, clients may log-in to the system 560 where multiple clients may be handled, optionally simultaneously.

As an example, the logging string 540 can include one or more NMR units, which may be part of one or more tools that are movable via movement of the logging string 540.

As an example, a combinable magnetic resonance (CMR) tool can be utilized for NMR logging. As an example, NMR measurements can be utilized for determining one or more of reservoir permeability, water cut, and hydrocarbon pore volume. As an example, NMR measurements may be utilized to evaluate porosity and permeability independent of mineralogy. As an example, NMR measurements may be suitable for characterizing thinly laminated reservoirs; low-contrast, low-resistivity pay zones; and carbonates.

As an example, a tool can include circuitry for implementing an enhanced-precision mode (EPM) pulse acquisition scheme to refine precision of NMR data associated with the smallest pores and heavy crude oils. As an example, processing of EPM acquisition data can provide total porosity along with partitioning into micro-, meso-, and macroporosity and estimates of the bound and free fluid. As an example, in complex lithologies, such information can facilitate determining the irreducibile water saturation and potential for water production.

As an example, a tool can include magnets such as permanent magnets that may extend above and/or below an antenna, where the antenna may be utilized for delivery of an oscillating magnetic field and/or receipt of responses from nuclei to a delivered oscillating magnetic field. As an example, consider a tool that includes magnets arranged above and below (e.g., approximately 12 cm above and approximately 12 cm below) an antenna (e.g., approximately 2.5 cm). Such an arrangement of components can be utilized to create a longer pre-polarizing field that can provide for increased logging speed (e.g., consider logging speeds to 1,200 meters per hour or more in a fast-relaxation environment).

As an example, an acquisition scheme can be implemented that provides for increased logging speed, increased vertical resolution and/or an arrangement of components (e.g., magnet(s) and antenna(s)) that may be beneficial to one or more logging operations. As an example, where total acquisition time of an acquisition scheme can be reduced, the length of a NMR unit may be reduced, which may reduce mass and demands of movement of a logging string (e.g., consider lesser energy for rotation of a reel, etc.).

As an example, a downhole acquisition scheme can be controlled via a downhole calibration scheme, which may include acquiring NMR signals. For example, consider a downhole calibration scheme that is performed responsive to one or more conditions, which may include one or more programmed and/or one or more sensed conditions. As an example, a downhole calibration scheme may be utilized to determine a pulse parameter or pulse parameters of a downhole acquisition scheme. For example, consider a downhole calibration scheme that can determine a pulse duration of a 90 degree pulse (T90) pulse, which may be specified in microseconds. In such an example, the 90 degree pulse (T90) may be an optimized 90 degree pulse ($T90_{opt}$) that improves signal strength of an NMR signal. Such an approach may improve downhole acquisition of NMR signal and hence NMR data responsive to one or more changing conditions in a downhole environment.

Figure 6:
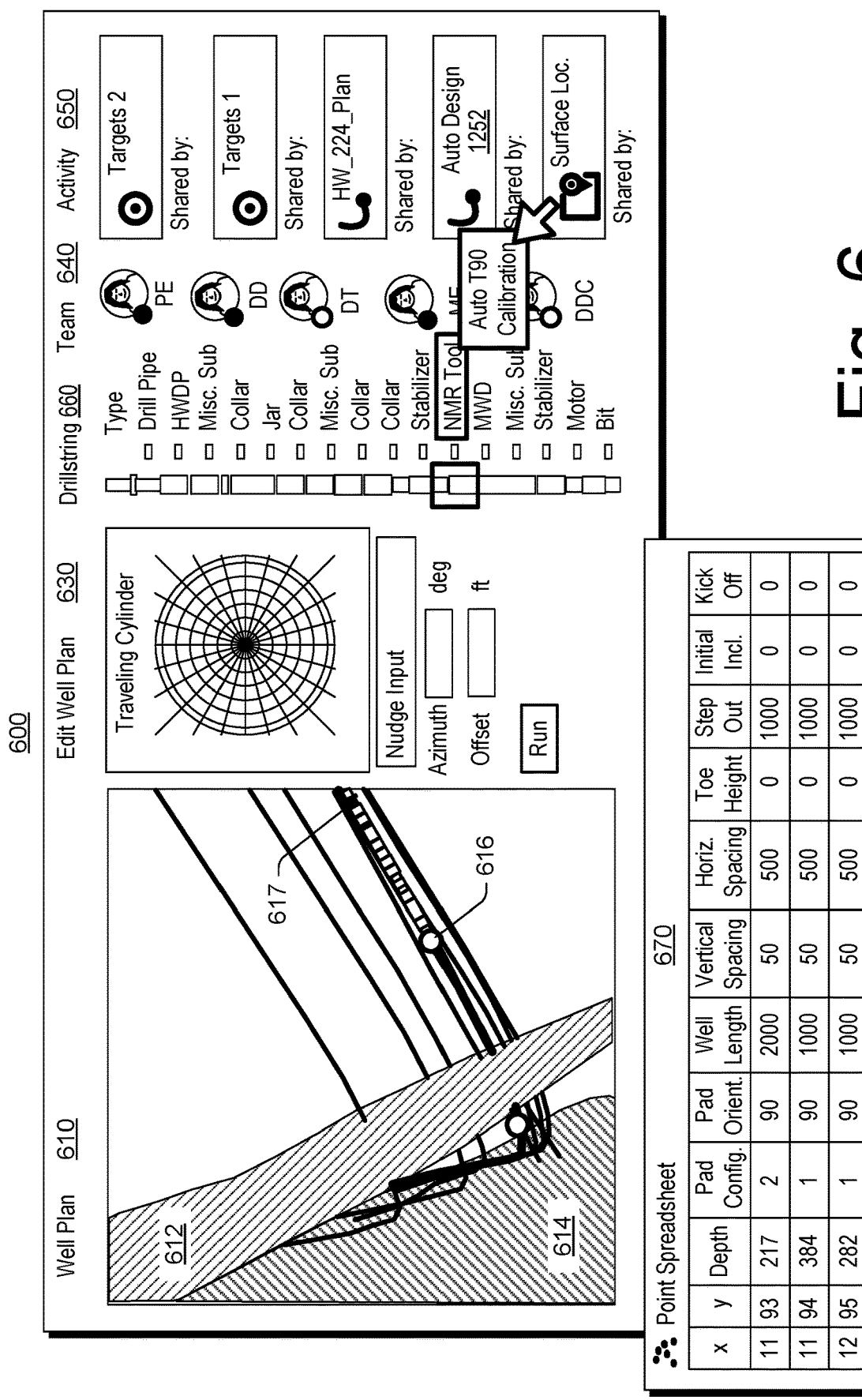
FIG. 6 illustrates an example of a graphical user interface.

FIG. 6 shows an example of a graphical user interface (GUI) 600 that includes information associated with a well plan. Specifically, the GUI 600 includes a panel 610 where surfaces representations 612 and 614 are rendered along with well trajectories where a location 616 can represent a position of a drillstring 617 along a well trajectory. The GUI 600 may include one or more editing features such as an edit well plan set of features 630. The GUI 600 may include information as to individuals of a team 640 that are involved, have been involved and/or are to be involved with one or more operations. The GUI 600 may include information as to one or more activities 650. As shown in the example of FIG. 6, the GUI 600 can include a graphical control of a drillstring 660 where, for example, various portions of the drillstring 660 may be selected to expose one or more associated parameters (e.g., type of equipment, equipment specifications, operational history, etc.). FIG. 6 also shows a table 670 as a point spreadsheet that specifies information for a plurality of wells. For example, the point spreadsheet can include coordinates, dimensions, etc., that specify a trajectory of a well, spacing of wells, etc.

As an example, the drillstring 617 can include one or more NMR units, which can be part of a tool or tools (e.g., a LWD assembly, a measurement sub, etc.). In such an example, information derived from NMR measurements may be utilized in control of an operation, planning of an operation, etc. As shown, the graphical control of the drillstring 660 can include an NMR tool, which may be selected such that one or more control actions can be set. For example, the NMR tool graphic can be selected to set an automated T90 calibration scheme that acts to perform automatic T90 calibrations during a logging operation or logging operations (e.g., LWD or other logging). As an example, during a downhole operation, the NMR tool graphic may become highlighted responsive to execution of an automated T90 calibration scheme. In such an example, a user may visualize the GUI 600 and position of the drillstring 617 and understand that one or more conditions may have changed in the downhole environment that triggered execution of the automated T90 calibration scheme, where a change may be made to a 90 degree pulse (T90) such that the 90 degree pulse is optimized ($T90_{opt}$).

As an example, a tool can include one or more nuclear magnetic resonant (NMR) units. As an example, a tool can be a combinable nuclear magnetic resonance tool, which may be referred to as a CMR tool.

NMR involves a phenomenon by which a nucleus absorbs electromagnetic radiation of a specific frequency in the presence of a strong magnetic field. A NMR technique can include exposing nuclei to a strong static magnetic field and perturbing them by a weak oscillating magnetic field to produce an electromagnetic signal with a frequency characteristic of the magnetic field at the nucleus. The process occurs near resonance, when the oscillation frequency matches the intrinsic frequency of the nuclei, which depends on the strength of the static magnetic field, the chemical environment, and the magnetic properties of the isotope involved.

As an example, a static magnetic field can be specified in units of tesla. A laboratory NMR unit may include a superconducting magnet that can produce a static magnetic field of the order of 20 tesla (20 T) or more. In logging operations, a logging tool may include a magnet or magnets that can be permanent rather than superconducting or may be non-superconducting electromagnets rather than superconducting where a field of the order of one tesla or less may be generated. As an example, a logging operation may utilize the Earth's magnetic field, which may be assumed to be static along a borehole and of the order of tens of microtesla (e.g., 20 microtesla or 0.2 gauss to 80 microtesla or 0.8 gauss). As mentioned, the frequency at which a nucleus "absorbs" energy depends on the strength of the static magnetic field and is referred to as the Larmor frequency or precessional frequency.

The precessional frequency of nuclei of a substance exposed to a static magnetic field $B_0$ can be determined using the Larmor Equation:

$$\omega = \gamma B_0$$

where ω is the Larmor frequency in MHz, γ is the gyromagnetic ratio in MHz/tesla and $B_0$ is the strength of the static magnetic field in tesla. As to $^1H$, consider a precessional frequency of 42.58 MHz for a static field of one tesla (T). In such an example, if the static field is 0.1 T, then the precessional frequency is 4.258 MHz; whereas, for a static field of 10 T, the precessional frequency would be 425.8 MHz.

A NMR unit can investigate a sample (e.g., a rock volume) that is outside the NMR unit while moving the NMR unit along a borehole. Such a NMR unit can include components to generate a static magnetic field and an oscillating magnetic field. In such an arrangement, the fields can be of respective strengths sufficient to penetrate at least approximately 1 cm or more into formation surrounding a borehole. The diameter of a borehole can limit the size of permanent magnets that can be used and, correspondingly, strength of a magnetic field that can be generated by a downhole tool.

As an example, a NMR unit may operate at or below several megahertz and generate a relatively weak (<1 T) and somewhat inhomogeneous magnetic field (e.g., gradients up to 20 gauss/cm). Where the Earth's magnetic field is utilized, an operating frequency may be of the order of approximately several kilohertz; noting that homogeneity may be greater than that of a NMR unit with its own magnet or magnets.

Such constraints generally make downhole NMR units more suitable for relaxation investigations; rather than chemical spectroscopy. Downhole NMR units can be operated using various techniques to account for noise, for example, acquiring a sufficient number of echoes and/or stack data to improve signal to noise ratio (S/N).

As an example, a NMR unit can utilize one or more permanent magnets rather than electromagnets to reduce surface-power requirement; can focus a sensitive region of the magnetic field at some distance into the formation, which can help to address mud (e.g., drilling fluid invasion); can use an RF pulse from a coil tuned to the Larmor frequency to help ensure that those nuclei in the sensitive region are in resonance; can control pulse duration, which may help to reduce dead times to allow for a better estimate of initial decay amplitude (e.g., as to porosity) measurement for short $T_2$ components (e.g., bound-fluid evaluation); and can provide for one or more types of pulse sequences, which may be for one or more purposes (e.g., measurement of additional rock, fluid properties, etc.).

As an example, a NMR unit can include features for handling gradients in a static magnetic field, which may cause molecular diffusion. For example, strength of a magnetic field gradient, G, may be controlled by tool design and configuration (e.g., tool size and tool frequency); by environmental conditions such as formation temperature; and by internal gradients induced by an applied field, $B_0$. As an example, characterization of gradients may enable in-gradient diffusion to be used for hydrocarbon typing.

As an example, a NMR unit may be part of a tool that aims to centralize or eccentralize the NMR unit (e.g., with respect to fields and formation). As an example, a tool can include one or more features that can act to position a NMR unit or a portion thereof with respect to a formation (e.g., wall of a borehole). For example, consider a mandrel type of tool or a pad type of tool.

The type of features can be a factor as to length of a NMR unit, which can affect so-called "vertical resolution". Vertical resolution refers to resolution of the NMR unit along a longitudinal axis of a tool, which is generally parallel to the longitudinal axis of a borehole. For deviated wells, including horizontal wells, the so-called "vertical resolution" is not a resolution that is aligned with the acceleration of gravity; rather, it can be at an angle thereto. As utilized herein, "vertical resolution" refers to resolution along a dimension that is substantially parallel to the longitudinal axis of a borehole in which a NMR unit is positioned.

As an example, a contact NMR unit, which may be a CMR type of NMR unit that is utilized in an eccentric manner, can include magnets and electronics that may provide higher vertical resolution that a centralized, non-contact NMR unit; however, possibly with a shallower depth of investigation (DOI) (e.g., or region of investigation (ROI)) and greater sensitivity to borehole rugosity. As an example, a NMR unit can include, additional to standard permanent magnets, "pre-polarization" magnets, which may be added to help ensure fuller polarization at a desired logging speed.

As an example, a NMR unit or units may operate at several different RF frequencies, optionally simultaneously, to measure multiple sample volumes. In the presence of a gradient magnetic field, pulses with different frequencies can cause protons in different (and parallel) regions of space (e.g., measurement or sensitive volumes) to resonate. Cycling through several frequencies excites protons in different cylindrical volumes, allowing measurements to be made more quickly. If the frequencies of multi-frequency measurements are relatively close together, then the sensitive volumes tend to be relatively close together; and, for practical purposes, the rocks sampled can be considered to be the same (e.g., akin to slice selection in medical MRI imaging).

As an example, a NMR unit may include features to acquire multiple echo trains using different values of wait time (TW), echo time, and variable magnetic gradients (G) in a single logging pass. The time between measurements made at multiple frequencies can be as little as the time of an echo train, and the time between measurements made at a single frequency can be approximately the time to repolarize (e.g., a TW). In a multi-frequency arrangement, thickness of sensitive volumes may be as small as approximately 1 mm.

As an example, a NMR unit can provide for $T_1$ acquisition, $T_2$ acquisition or $T_1$ and $T_2$ acquisition. As mentioned, multi-frequency operation may provide for measurements at multiple DOIs (e.g., approximately 1 cm to approximately 10 cm), which may allow for invasion effects to be accounted for in data interpretation to provide for determination of near-wellbore fluid saturation and oil properties at higher resolution.

As an example, an automated downhole calibration scheme may be executable for one or more frequencies. For example, consider an automated downhole calibration scheme that can optimize a first 90 degree pulse of a first frequency and that can optimize a second 90 degree pulse of a second frequency. In such an example, a change in one or more downhole conditions may be detected that acts to trigger execution of the automated downhole calibration scheme. As an example, an automated downhole calibration scheme may include inserting a calibration pulse sequence or calibration pulse sequences into one or more downhole acquisition schemes that acquire NMR signals for evaluation of one or more DOIs (e.g., or ROIs) such that signals indicative of an optimal 90 degree pulse ($T90_{opt}$) are acquired, which may be utilized to set one or more 90 degree pulses of one or more of the one or more downhole acquisition schemes, which may utilize one or more RF frequencies.

A NMR technique can include various sequential actions such as, for example, alignment (polarization) of magnetic nuclear spins in a static magnetic field $B_0$; perturbation of the alignment of the nuclear spins by a weak oscillating magnetic field (e.g., via an RF pulse); and detection of the NMR signal during or after the RF pulse, due to the voltage induced in a detection coil by precession of the nuclear spins around $B_0$. After an RF pulse, precession tends to occur at a nuclei's intrinsic Larmor frequency and, in itself, does not involve transitions between spin states or energy levels. In acquiring NMR measurements, the static and oscillating magnetic fields can be chosen to be perpendicular to each other, which can help to maximize NMR signal strength. For example, $B_1$ can be described in a classical sense as being perpendicular to $B_0$.

As an example, a NMR unit can be part of a tool such as the CMR tool (Schlumberger Limited, Houston, Tex.). The CMR tool can utilize one or more techniques, which may include a particular technique referred to as a phase alternating pairs (PAPs) technique to achieve one or more dynamic vertical resolutions, for example, in a high-resolution mode, a standard resolution mode or a fast mode. For example, consider the following vertical resolutions that include static and dynamic: static with 6-in (e.g., 15.24 cm) measurement aperture; dynamic (high-resolution mode) with 9-in (e.g., 22.86 cm), three-level averaging; dynamic (standard mode) with 18-in (e.g., 45.72-cm) vertical resolution, three-level averaging; and dynamic (fast mode) with 30-in (e.g., 76.20-cm) vertical resolution, three-level averaging.

An example of the PAPs technique is described in U.S. Pat. No. 5,023,551 to Kleinberg et al., issued 11 Jun. 1991, which is incorporated by reference herein. The PAPs technique can be utilized for measuring an indication of an attribute of a volume of a formation with a borehole tool that produces a static magnetic field in the volume of the formation, that produces an oscillating magnetic field in the volume of the formation and that measures an induced magnetic signal where the PAPs technique can include (i) producing a static magnetic field in the volume of the formation; (ii) producing oscillating magnetic fields according to a pulse sequence $[W_i-180-\tau_i-90-(t_{cp}-180-t_{cp}-\text{echo})_j]_i$ where $j=1, 2, \ldots J$, and J is the number of echoes collected in a single Carr-Purcell-Meiboom-Gill (CPMG) sequence, where $i=1, \ldots I$, and I is the number of waiting times used in the pulse sequence, where $W_i$ are waiting times before a CPMG sequence, where $\tau_i$ are recovery times are recovery times before a CPMG sequence, and $t_{cp}$ is the Carr-Purcell (cp) spacing to induce signals in the volume of the formation (e.g., as to be measured). In the foregoing pulse sequence, 180 refers to a 180 degree pulse and 90 refers to a 90 degree pulse. As mentioned, an automated downhole calibration scheme may act to calibration a duration of a pulse such as, for example, a 90 degree pulse, a 180 degree pulse, etc. As an example, a 180 degree pulse may be a pulse that has a duration that is twice that of a 90 degree pulse.

Figure 7:
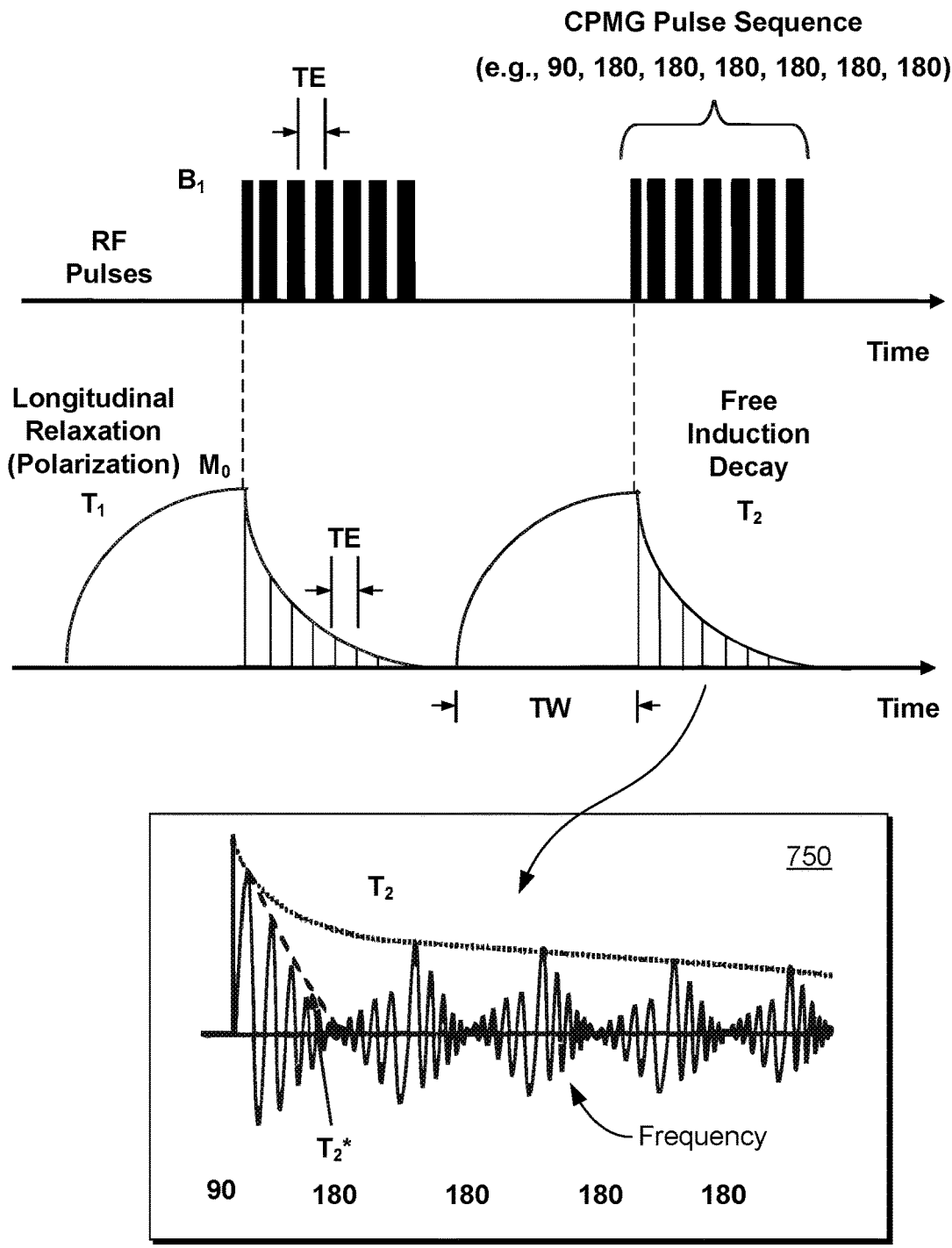
FIG. 7 illustrates an example of a method.

FIG. 7 shows an example of a method 700 that includes emitting RF pulses for an oscillating field $B_1$ to affect nuclei exposed to a static magnetic field $B_0$. In the method 700, two CPMG pulse sequences are illustrated, which include a 90 degree pulse and a train of 180 degree pulses. In the method 700, for a given time of a sample in a static field $B_0$, an acquired NMR signal strength can depend on accuracy of the 90 degree pulse of the oscillating field $B_1$ where the greatest signal strength can be for an optimal 90 degree pulse ($T90_{opt}$). Various parameters may characterize a 90 degree pulse. Where power delivered is to be relatively constant (e.g., an approximately rectangular pulse of constant power), a pulse duration parameter can characterize a 90 degree pulse. Such a pulse duration parameter may be referred to as a pulse width, which may be, for example, a value in microseconds.

As shown in FIG. 7, the CPMG pulse sequence or simply "CPMG sequence" uses a train of $\pi$ pulses ($\pi=180$ degrees) to refocus inhomogeneous broadening of nuclear spins, which can help to enhance S/N, measure diffusion, measure $T_2$ processes (free induction decay), and reduce experimental time.

Like the Hahn echo, a $\pi$ pulse (180 degrees) is placed after a $\pi/2$ pulse (90 degrees) in the NMR experiment, which refocuses the spins leading to echo formation. For CPMG echo train acquisition, n $\pi$ pulses are applied each $2n t r$ (if the sample is spinning), resulting in n echoes. The number of echoes which can be acquired is directly related to $T_2$ processes. Neglecting pulse imperfections, the echo tops as shown in a plot 750 of FIG. 7 will diminish in intensity due to coherence losses between spins, which is homogenous $T_2$, as the $\pi$ pulses refocus the inhomogeneous $T_2$ due to the varying magnetic field experienced by the sample.

As shown in FIG. 7, a maximum amplitude is indicated as $M_0$, which can be a result of a wait time (TW) for longitudinal relaxation (polarization). In the CPMG sequences shown, the first pulse is 90 degrees, which can be thought of as tipping or rotating aligned nuclei into a plane. Once in the plane, some nuclei will lag and some nuclei will advance. Each of the 180 degree pulses acts to "flip" the lagging nuclei and advancing nuclei, which, in time, will cause a re-focusing of the nuclei, as indicated by the successive, yet decaying, amplitude peaks in the plot 750. Where pulse energy and frequency are constant, a 180 degree pulse can be approximately double the duration of a 90 degree pulse, which is approximated by the thickness of the individual pulses in the method 700 of FIG. 7. The echo time is shown to be the time between 180 degree pulses or, for example, the time between amplitude peaks.

Figure 8:
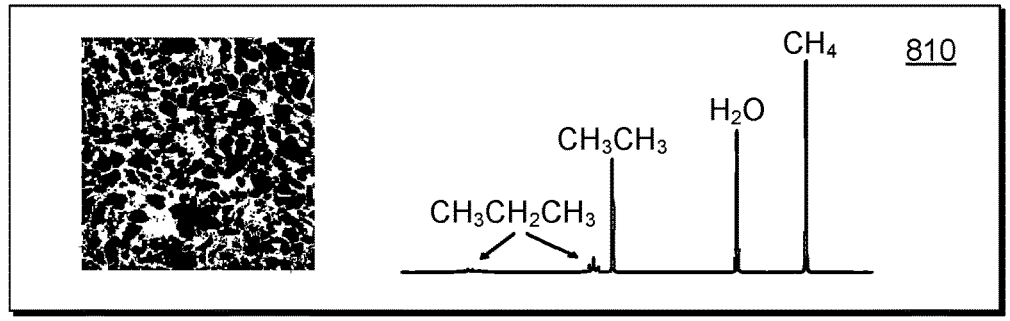
FIG. 8 illustrates an example of a method.
Figure 8:
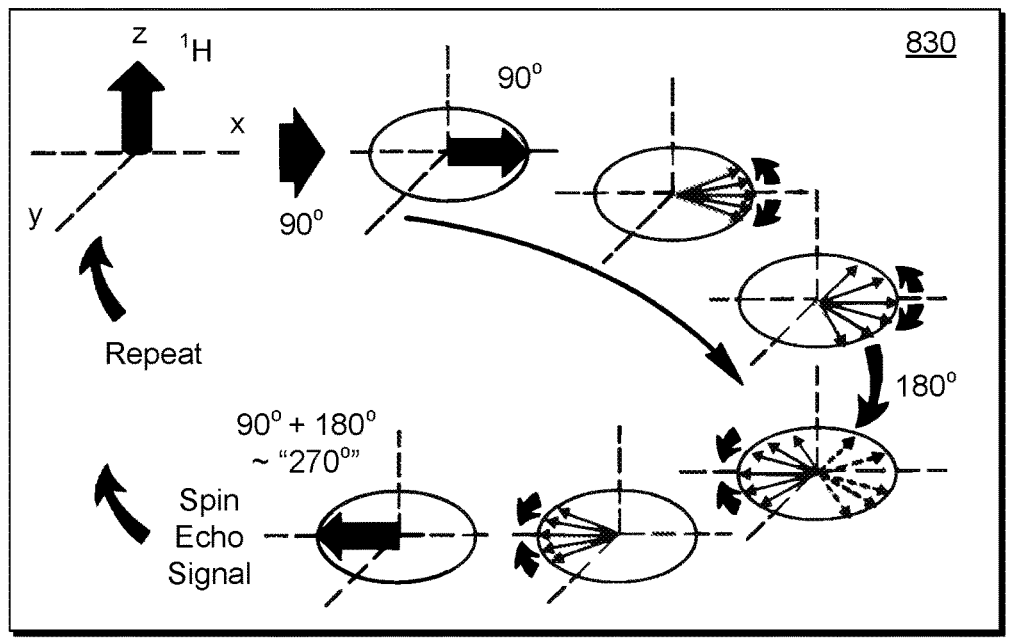
Figure 8:
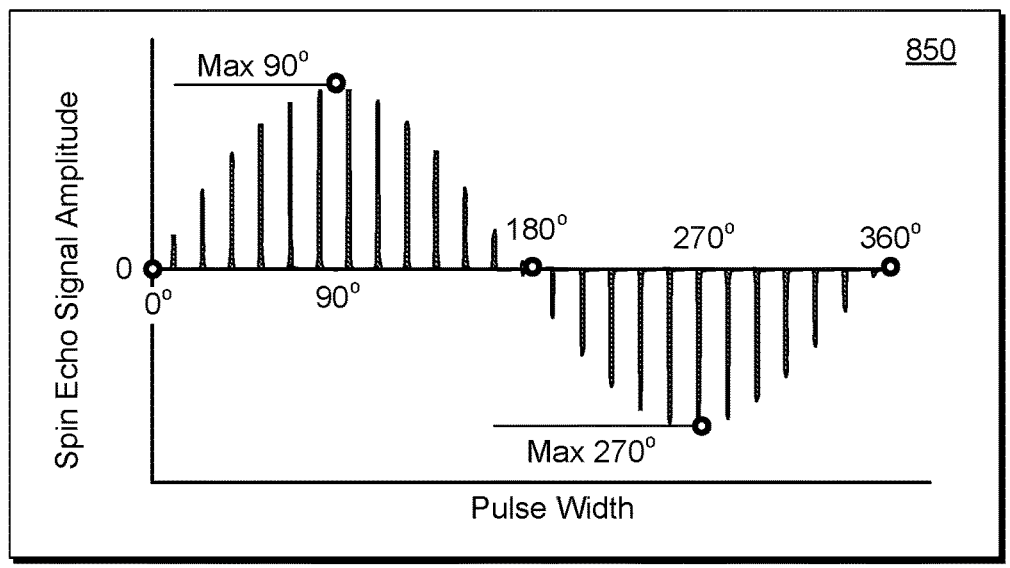

FIG. 8 shows an example of a method 800 that includes making NMR measurements with respect to fluid in a formation that includes pores with fluid in at least a portion of at least some of the pores. In the example of FIG. 8, the pores can include submillimeter pores. For example, a formation diagram is shown with NMR $^1$H spectra of various examples of fluid types in a block 810 where the dimensions of the formation diagram may be approximately 0.1 mm to approximately 10 mm. Fluid in the formation can be exposed to a relatively static magnetic field ($B_0$) such that at least some protons in the fluid align with the static magnetic field to generate a magnetic moment that can be manipulated using a time varying magnetic field ($B_1$). As the protons can differ with respect to their environments, NMR spectroscopy can be utilized to estimate composition; however, in a downhole environment, NMR measurements may be utilized in a more bulk manner, for example, to characterize fluid composed of different chemicals without specifically identifying composition and/or to characterize a formation (e.g., pore characteristics, etc.).

As mentioned, protons may be expected to "spin" at their Larmor frequency, which depends on strength of a static field (e.g., $B_0$). Further, as mentioned, a time varying field (e.g., $B_1$) may be utilized to manipulate the protons in a manner such that a spin echo signal is produced. FIG. 8 includes a block 830 that illustrates an example of a spin echo sequence that can produce a spin echo signal. As shown, the spin echo sequence includes a 90 degree pulse (e.g., $\pi/2$) followed by a 180 degree pulse (e.g., $\pi$), which acts to refocus "spins" such that the spin echo signal is produced upon refocusing. In the example spin echo sequence of the block 830, the magnetic moment is shown as being at an angle of approximately 270 degrees for the spin echo signal (e.g., refocused "spins").

In the spin echo sequence of the block 830, the ability to produce a maximum amplitude of the spin echo signal depends in part on an ability to produce a 90 degree tip angle. For example, if the tip angle is 85 degrees or 95 degrees, the vector shown (e.g., from the z-axis being tipped onto the x-axis) will not produce a maximum spin echo signal for a given antenna that is to measure the spin echo signal, which can be the same antenna that delivers the time varying magnetic field to cause tipping.

To generate a 90 degree tip angle, or a 90 degree pulse (T90), an adjustable parameter of a pulse sequence of a NMR tool can be the pulse width of an RF pulse (e.g., time varying, $B_1$ field pulse). As explained, prior to applying such an RF pulse, the majority of nuclear spins are aligned parallel to the static magnetic field ($B_0$). As shown in FIG. 8, the axis of alignment may be designated as the z-axis (see, e.g., the block 830) and the bulk magnetization can be shown as a vector. As explained, application of an RF pulse at the appropriate frequency will rotate the bulk magnetization by a specific angle. One or more pulses may be characterized by a specific desired angle of rotation. The angle of rotation depends on intensity of the pulse (tpwr) and width of the pulse (pw). As mentioned, a pulse may be relatively rectangular in shape when plotted as intensity (tpwr) versus time; noting that one or more other shapes may be utilized that can be characterized with respect to width (pw). In general, the maximum measurable signal can be recorded following a 90 degree rotation or pulse. Thus, a 90 degree pulse width is defined as the amount of time the pulse of RF energy is applied to the particular sample to tip the bulk magnetization from the z-axis precisely into the x,y plane. For example, the 90 degree pulse width for $^1$H NMR experiments might be about 8 microseconds on the VARIAN INOVA 500 laboratory NMR instrument, which has a 11.75 T, 51 mm superconducting magnet.

As mentioned, one parameter of a pulse is the strength of the oscillating magnetic field associated with the RF pulse in terms of the rotation frequency. For example, if it takes 8 microseconds to rotate a bulk magnetization vector 90 degrees, then using the same RF intensity it will take 4 times 8 microseconds (e.g., 32 microseconds) to rotate the bulk magnetization vector 360 degrees. In the foregoing example, the intensity of the RF field may be described as a magnetic field that causes the bulk magnetization vector to rotate at a rate of $\frac{1}{32}$ microseconds, or at 31,250 Hz (31.25 KHz). In NMR technology, a 300, 400, or 500 MHz static $B_0$ field can be approximately 10,000 to 20,000 times stronger than an oscillating $B_1$ field of an RF pulse.

In laboratory NMR instruments, the pulse width may be entered manually in microseconds, for example, by typing "pw=desired value" in microseconds. However, the exact value of a 90 degree pulse depends upon the sample (e.g., nucleus, solvent, etc.) as well as the instrument (e.g., probe, etc.).

In FIG. 8, a block 850 includes a plot of spin echo signal amplitude versus pulse width of a time varying magnetic field (e.g., $B_1$). As shown, the amplitudes have a sinusoidal shape, which may be approximated by a sine function (e.g., or a cosine function, etc.). U.S. Pat. No. 6,624,629 B1 is incorporated by reference herein (Speier et al., issued 23 Sep. 2003), which includes the following equation:

$$\sin \alpha_{exc} > \phi(\alpha_{exc})/\phi_{max} > \sin^2 \alpha_{exc}.$$

where $\phi$ is the spin echo amplitude, $\phi_{max}$ is defined as $\phi(\pi/2)$ and where $\alpha_{exc}$ is the flip angle.

As mentioned, a flip angle can be varied by adjusting amplitude of a RF field pulse (e.g., power) and/or by adjusting duration of a RF field pulse (e.g., pulse width).

As indicated, a sine function can be an ideal representation of amplitude versus pulse width; noting that a sine function tends to have a somewhat "flatter" region defined by steeper regions to either side. As an example, a NMR tool's accuracy may be optimized by execution of a downhole automated calibration scheme such that operation of the NMR tool is more robust to some types of variations that may occur downhole. Such a downhole automated calibration scheme may also be suitable to account for differences between different NMR tools (e.g., due to operational history, manufacturing, etc.). While a sine function is mentioned, one or more other trigonometric functions (e.g., cosecant, cosine, cotangent, secant, and tangent) may be utilized.

In downhole logging, accuracy may be relatively unknown; whereas, precision may be better known. Accuracy can refer to the closeness of a measured value to an actual value; whereas, precision can refer to the closeness of two or more measurements to each other. As an example, a downhole automated calibration scheme can aim to improve accuracy in a manner that accuracy is relatively robust to some types and/or ranges of variations in a downhole environment. As mentioned, a sine function can have a flatter region, which can be in a range, for example, as to 90 degrees, from approximately 85 degrees to approximately 95 degrees about 90 degrees. Outside of that region, the sine function slope increases such that a variation in a downhole environment may result in quite inaccurate measured NMR values. However, for a 180 degree pulse, a change in a downhole environment can result in a greater change in accuracy as the 180 degree pulse can correspond to a zero crossing (e.g., a steeply sloped) portion of a sine function. As explained, amplitude of various pulse sequences depends on accuracy of a 90 degree pulse. As such, a method may be utilized for 90 degrees rather than 180 degrees; noting that either one or both may be utilized.

As to an NMR tool, the $B_1$, RF field in an ROI may be different than expected where a difference can cause a flip angle to be sub-optimal, thereby affecting an NMR measurement. For example, a variation in the $B_1$ field may be due to, as some examples, a decrease in the power supply voltage of the NMR tool that causes the pulse amplitude of the RF pulse to be different than expected; the presence of magnetic drilling debris; a temperature change; and/or imperfections in the field geometry of the NMR tool.

As mentioned, RF pulses may be relatively rectangular and depend on antenna and circuitry characteristics. As an example, a pulse shape may be characterized to provide for consistency with respect to pulse width. As an example, a characterization may consider an antenna quality factor (Q-factor). As an example, a pulse width approach to optimization may be utilized with a relatively consistent pulse shape.

As shown in the example of FIG. 8, where the pulse width is zero, the amplitude of the spin echo signal is zero and, similarly, for 180 degrees and 360 degrees. However, for 90 degrees and 270 degrees, the amplitude of the spin echo signal can be at a maximum. As an example, a series of pulse sequences may be executed with pulse width times sufficient to capture amplitude data as in the plot of the block 850. In such an example, a 90 degree pulse width may be determined using one or more pulse width points such a 90 degrees, 180 degrees, 270 degrees and 360 degrees. The suitability of such an approach can depend on available time and various other factors. For example, 360 degrees may be the most accurate as 90 degrees may tend to exhibit some distortion (e.g., flatness) and as 180 degrees may exhibit some dependency on repetition. Where 360 degrees is utilized, the pulse width, given as a time, may be divided by four. For example, where the 360 degree pulse width time is 100 microseconds, the 90 degree pulse width time may be estimated to be 25 microseconds.

In laboratory NMR instruments, one type of calibration algorithm involves relatively continuous administration of RF energy while measuring magnetization in the y-axis. Such an algorithm is referred to as the "pulsecal" algorithm on BRUKER NMR instruments. Such an algorithm subjects a sample to relatively continuous irradiation about the x axis and, while being irradiated, the magnetization vector rotates in the z,y plane at a nutation frequency proportional to the pulse power. The magnetization on the y axis defines a sine function where Fourier transformation (FT) of this magnetization gives an antiphase doublet centered at zero whose splitting Δv is twice the nutation frequency. The reciprocal of the nutation frequency is the time it takes the magnetization vector to rotate one complete cycle in the z,y plane and therefore the time it takes to rotate by one quarter of a cycle (a 90 degree pulse duration), which can be defined as $1/(2\ \Delta v)$. The irradiation is relatively continuous, for example, due to instrument limitations because magnetization is to be detected. To allow for detection of magnetization, the irradiating field can be turned off long enough to sample magnetization, which introduces a dwell period and hence a duty cycle. In such an approach, each dwell period can be divided up into a period for irradiation and a period for detection. The duty cycle for the irradiation is the fraction of time for which the sample is being irradiated. The magnetization can be sampled when the power is off. As in the case for continuous irradiation, the magnetization vector still rotates in the z,y plane however, the rotation is slower as it is scaled according to the duty cycle. The duration of the 90 degree pulse is $d/(2\ \Delta v)$, where d is the duty cycle for irradiation. Such an approach can involve a real FT of the nutation sine wave, so the nutation frequency (taking the duty cycle into account) is one half the frequency between peaks.

The NMR phenomenon is inherently low in signal strength, which is a reason for the drive toward ever increasingly stronger static magnetic fields because, as static magnetic field strength increases, the population of aligned nuclei increases. Given the inherently low signal strength, pulse sequences are often repeated in an effort to increase signal to noise (SNR). As explained with respect to the block 850, a proper 90 degree pulse width (e.g., that is optimal for maximum spin echo signal strength) can also help to increase SNR. Thus, various aspects of NMR measurements can be utilized to increase SNR. However, there can be tradeoffs where NMR measurements are constrained by one or more factors (e.g., time, integrity of NMR unit, etc.).

As mentioned, in a laboratory environment where conditions remain relatively stable, a NMR instrument may be calibrated using a calibration technique that aims to reproduce the data shown in the block 850 to determine a proper 90 degree pulse width (e.g., via a series of individual sequences with different pulse widths or via a nutation approach such as "pulsecal"). In contrast, a downhole environment, a NMR unit may be part of a tool that is to be conveyed in a borehole, for example, to generate an NMR log along a length of the borehole. Further, such a downhole method may be accompanied by various constraints (e.g., time, equipment, operator, etc.). Yet further, a downhole NMR unit does not produce a static magnetic field ($B_0$) that has a shape or homogeneity of a laboratory NMR instrument. Additionally, the concept of what is a "sample" differs, as for downhole NMR, the sample is what surrounds the downhole NMR unit at a particular depth, at a particular time, where conditions can change with respect to time.

In a downhole NMR acquisition method, conditions of the downhole environment can change and/or conditions of the tool itself may change. For example, temperature of a downhole environment may change at a position in a borehole and/or as a tool is conveyed in the borehole (e.g., to deeper or shallower measured depths, etc.). As an example, a tool may generate some amount of heat energy, which may be transferred to a surrounding environment in a manner that depends on the nature of the surrounding environment. For example, as a surrounding environment becomes hotter (e.g., higher temperature), the driving force for transfer of heat energy from a tool to the surrounding environment can diminish and the tool may experience an increase in temperature. As an example, a surrounding environment may be a source of heat energy that can be transferred to a tool to thereby cause heating of the tool. As an example, where a tool is in a fluid environment, flow of fluid may be a source and/or a sink as to heat energy, which may cause the tool to heat or cool. As an example, heat transfer via fluid or fluids can depend on various fluid related factors such as fluid properties (e.g., density, viscosity, composition, etc.) and fluid flow; noting that heat transfer can depend on type of flow regime (e.g., laminar, turbulent, etc.). As to types of fluid downhole, consider one or more of drilling fluid, formation fluid, injection fluid, chemical treatment fluid, hydraulic fracturing fluid, etc. As such, one or more types of fluid may exist in a downhole environment that can surround at least a portion of a NMR tool.

As an example, a downhole tool may be calibrated in an environment where time permits; however, where the downhole tool's environment changes, such a calibration may become less accurate. As the calibration becomes less accurate, tradeoffs may come to the forefront such as, for example, stopping conveyance of the downhole tool to recalibrate; however, as the number of stops increases, so does the amount of time demanded to survey a formation along a length of a borehole. Additionally, a downhole tool may be exposed to detrimental environmental conditions for a longer length of time due to stopping, which may act to compromise integrity of the downhole tool and/or quality of NMR measurements made by the downhole tool.

As an example, a method can include executing an automated downhole calibration scheme, which may be executed according to one or more of programming and sensing. For example, consider a programmed approach where each $n_I$ pulse sequence has an appended calibration pulse sequence, where the parameter $n_I$ may be selected based on expected downhole conditions, length of a downhole logging operation, speed of a downhole logging operation, etc. In such an example, where conditions are expected to be relatively constant, a larger value of $n_I$ may be selected; whereas, where conditions are expected to be changing, a smaller value of $n_I$ may be selected. As an example, the parameter $n_I$ may be programmed to depend on depth such as measured depth or total vertical depth. For example, where a particular depth range includes a formation of interest, to help assure increased signal, the parameter $n_I$ may be set to a smaller value such that a 90 degree pulse is optimized. While depth is mentioned, one or more other factors may be utilized to adjust the parameter $n_I$. For example, consider power where a lower power level (e.g., battery power level) adjusts the parameter $n_I$ upward such that fewer pulse sequences are executed. As another example, the parameter $n_I$ may depend on temperature or temperature gradient (e.g., with respect to time, depth, etc.). For example, the parameter $n_I$ may increase responsive to an increase in temperature, a decrease in temperature, or detection of a temperature gradient that is above a predetermined threshold or below a predetermined threshold. As another example, consider antenna quality factor (Q-factor), where a change in the antenna Q-factor causes a change in the parameter $n_I$ (e.g., to increase $n_I$ to account for a change in the antenna Q-factor). The Q-factor is a dimensionless indicator for the loss mechanisms in an antenna that can be defined as the ratio of stored and dissipated energy.

As an example, a NMR tool may be operated to determine a Q-factor. For example, consider measuring a frequency response of an antenna where the frequency response can be utilized to determine a Q-factor (e.g., a Q-factor value). As an example, a method can utilize a low voltage signal delivered via the antenna and then measure a response. As an example, a method can make measurements at different frequencies and sweep across a resonance curve and determine a top frequency response. As an example, in a time domain, an antenna may be pinged with low voltage and the response analyzed. As an example, a change in one or more conditions may be utilized to trigger measuring Q-factor. As an example, where a change in drilling fluid (e.g., salinity, etc.), a change in temperature, etc., occurs, a NMR tool may be instructed to measure Q-factor. As an example, Q-factor can change due to, for example, a change in conductivity of one or more fluids. As example, changes in Q-factor may be expected to change relatively gradually with respect to depth. As an example, where an optimal pulse width is determined that is in a direction that does not follow an expected direction, one or more other factors may be at play such as, for example, debris attracted to (e.g., stuck onto) the NMR tool due to magnetic attraction forces, etc. In such an example, a cleaning operation may be triggered, which may aim to clean the debris from the NMR tool.

As an example, a pulse sequence to determine an optimal X degree pulse width can be a spin echo pulse sequence (SE) and a pulse sequence to characterize a formation can be a different pulse sequence such as the CPMG pulse sequence (e.g., or PAPs, etc.). Where the parameter $n_I$ is utilized, where $n_I$ is three, consider: CPMG-CPMG-CPMG-SE-CPMG-CPMG-CPMG-SE, etc. In such an example, the SE is appended to the third CPMG. In such an example, the SE may be for a plurality of different pulse widths (e.g., in a range of pulse widths) or each of the SE may be for a different pulse width (e.g., in a range of pulse widths). As an example, several SE at a particular pulse width may be utilized where results are averaged or, for example, a single SE may be performed for each particular pulse width, which may conserve time and energy. As an example, a method can include acquiring NMR signals for two different types of pulse sequences and analyzing NMR signals from one type of sequence to characterize a formation and analyzing NMR signals from another type of sequence to optimize a pulse width. In such an approach, the processing and/or the memory for the latter may be less demanding than the former. As an example, an optimization pulse sequence may be "lightweight" and pared down to a minimum number as desired or otherwise determined to be adequate to optimize a pulse width. As an example, an optimization pulse sequence can be executed in a fraction of the time demanded to execute an acquisition pulse sequence that is utilized to characterize a formation (e.g., to form a NMR formation log, etc.). As an example, a NMR tool can generate a pulse width log or a pulse width change log, which may be compared to one or more other logs (e.g., versus depth, etc.), which may provide some indications as to actual operations performed by the NMR tool and actual and/or possible reasons why a change occurred in pulse width, why an optimization was triggered, etc.

As an example, the parameter $n_I$ may be indexed such as $n_{Ij}$, where the sub-script "j" indicates how many SE repeats are to occur, whether for a common pulse width or for different pulse widths. For example, where j is equal to 5, it can mean that a spin echo sequence is executed for a first pulse width five times; or, it can mean that five different pulse widths are executed. As an example, another sub-script may be introduced to distinguish such approaches.

As an example, a method can include receiving a trigger signal responsive to one or more conditions and, responsive to receipt of the trigger signal, selecting a pulse characterized at least in part by a pulse width that aims to maximize an NMR signal such as, for example, a spin echo signal. In such an example, a trigger signal can be based on one or more sensed conditions. For example, consider temperature, where a change in temperature with respect to time and/or distance (e.g., conveyed distance) in a borehole can cause issuance of a trigger signal. As another example, consider antenna Q-factor.

The definition of the Q-factor has been generalized to apply to coils and condensers, resonant circuits, resonant devices, resonant transmission lines, cavity resonators, material Q and spectral lines. As to resonant devices, in the context of resonators, two different common definitions for Q-factor become approximately equivalent as the Q-factor becomes larger, meaning the resonator becomes less damped. One of these two definitions is the frequency-to-bandwidth ratio of the resonator. Such a definition may utilize $f_r$ as resonant frequency or $f_c$ as center frequency along with bandwidth such as $f_2-f_1$ (where $f_2>f_1$) or $\Delta f$ where the bandwidth is the resonance width or full width at half maximum (FWHM) (e.g., the bandwidth over which the power of vibration is greater than half the power at the resonant frequency, $\omega_r=2\pi f_r$ is the angular resonant frequency, and $\Delta \omega$ is the angular half-power bandwidth.

For a coil antenna, consider the following equation for the Q-factor, which is the ratio of energy stored in an oscillating resonator to energy dissipated per cycle by damping processes:

$$Q=\text{(max energy stored/average energy dissipated per cycle)}=\omega L/R$$

In the foregoing equation, L is the inductance of the coil and R is the coil resistance. The Q-factor, or Q, can be "unloaded" or "loaded", depending on whether the sample under investigation is included or not. For example, $Q_{unloaded}$ can be without the sample while $Q_{loaded}$ can be with sample losses. The Q values for loaded coils tend to be smaller than the Q values for unloaded coils. As an example, in a laboratory, the Q value of a coil can be estimated using an RF probe and a network analyzer. A ratio between unloaded and loaded values can be referred to as a coil sensitivity.

As to RF antennas, $R_{sample}$ is usually much larger than $R_{antenna}$ where an increase in $R_{sample}$ will tend to increase noise and power demands to excite (e.g., tip) spins; while a reduction in $R_{antenna}$ tends to improve SNR, though such an improvement may be slight. In MRI and NMR laboratory equipment, a sample tends to be placed in a space defined by a coil such that a filling factor can be defined where a greater filling factor tends to provide gains in SNR. In downhole tools, the sample (e.g., the formation) is not within a space defined by an RF coil; rather, the formation is exterior to the tool and hence exterior to the antenna.

As mentioned, a NMR tool can be utilized to measure formation properties by transmitting RF pulses and receiving echo signals from nuclear spins in the formation. As mentioned, a NMR pulse sequence may be the CPMG pulse sequence as in FIG. 7, where a train of RF pulses is applied to the antenna and the echo signals are formed in between of those pulses.

In the CPMG pulse sequence, the optimal duration of the first pulse, which is desired to be a 90 degree pulse (e.g., T90) is determined by the strength of the RF magnetic field ($B_1$) in a region of investigation (ROI). An optimal T90 may be represented by the following equation: $T90_{opt}=\pi/(2*\gamma*B_1)$.

In the CPMG pulse sequence, other pulses in the sequence are T180 pulses which can be twice as long as the T90 pulse; noting that actual T180 pulse to T90 pulse ratio depends on the shape of the pulses. As an example, an optimal length of a pulse (or pulses) may be determined experimentally either during a tool master calibration by a Pulse Width Optimization (PWO) procedure (PROVISION PLUS procedure, Schlumberger Limited, Houston, Tex.) or, for example, as part of a tool characterization (e.g., MR SCANNER, CMR PLUS and CMR NG tools, Schlumberger Limited, Houston, Tex.).

Figure 9:
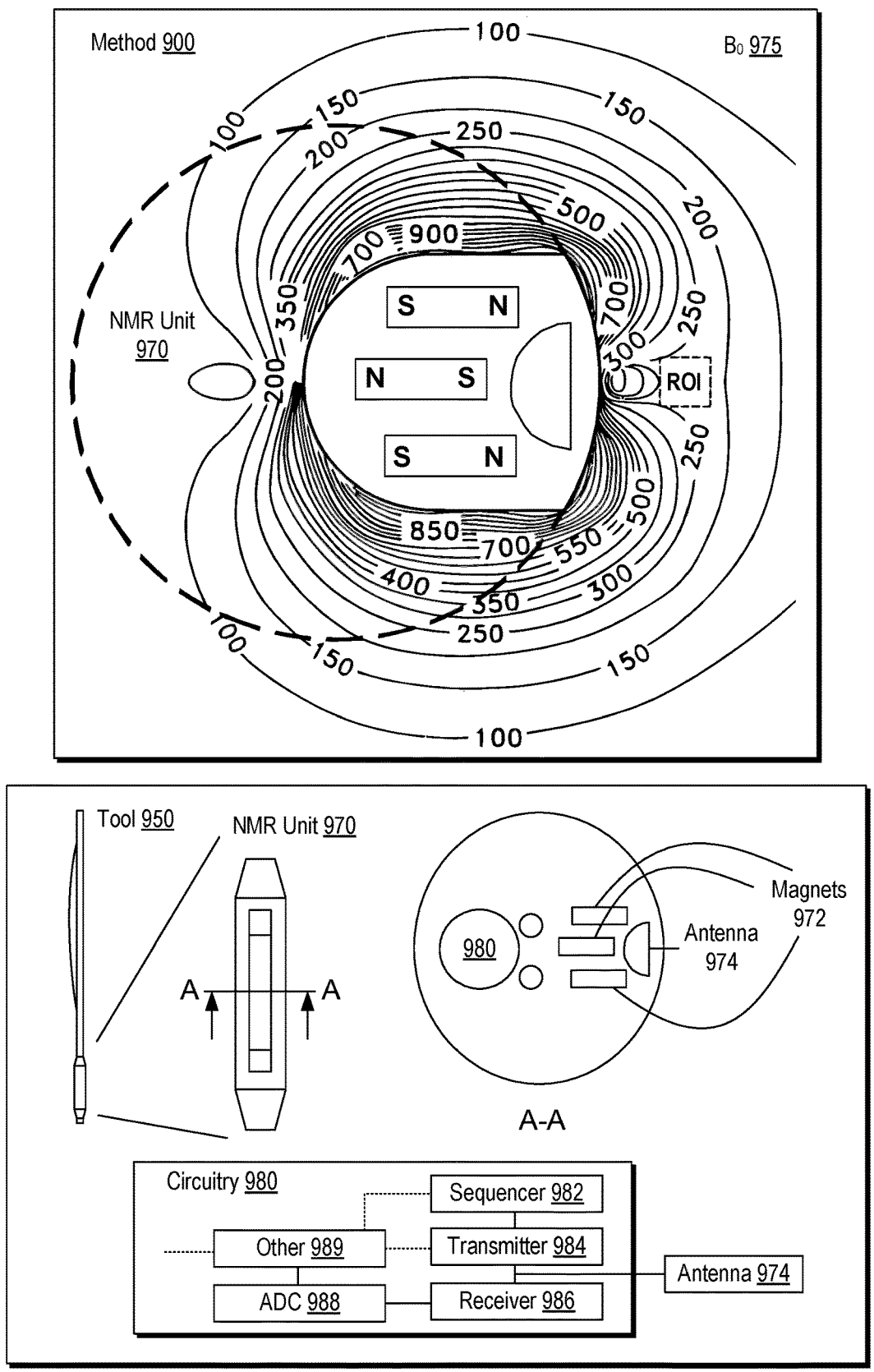
FIG. 9 illustrates an example of a method and an example of a tool.

FIG. 9 shows an example of a method 900 with respect to a downhole NMR unit 970 of a downhole tool 950 and a sensed region of interest (ROI) where magnets 972 of the NMR unit 970 have a $B_0$ field 975, which may be shaped according to contours as shown in FIG. 9, where values may be relative and may change depending on conditions such as temperature. As shown in FIG. 9, the $B_0$ field 975 tends to diminish in strength in a direction radially outward from the NMR unit 970. In the example of FIG. 9, the magnets 972 are arranged to generate a region that may be a distance from an outer perimeter of the body of the NMR unit 970 where the distance can include or be within a formation. The distance of the region indicated by the label ROI may change with respect to time and may change with respect to strength, as can depend on temperature of the magnets 972.

In various instances, the body of the NMR unit 970 may be separated a distance from a formation by material such as, for example, fluid, which may include one or more of reservoir fluid, drilling fluid (e.g., mud), injection fluid (e.g., as to water flooding, etc.), etc. Such fluid may include other material, for example, consider drilling fluid that includes rock cuttings. As an example, various types of material may have properties that can impact a static magnetic field and/or a time varying magnetic field and/or operation of an antenna (e.g., for transmission and/or reception). As an example, a body of a NMR tool may be surrounded by fluid that can include other material, which is surrounded by a borehole wall as defined by a formation (e.g., or formations). As a formation can be porous, fluid exchange may occur between fluid in an annulus about a body of a NMR tool and a formation (e.g., via a borehole wall). As such, conditions in a downhole environment can be dynamic, which can give rise to various challenges in acquiring and analyzing NMR data.

In the example of FIG. 9, the method 900 includes exposing the sensed region to a static magnetic field of the magnets 972, utilizing an antenna 974 (e.g., or other transmitter) to generate an oscillating field that penetrates the sensed region, and utilizing the antenna 974 (e.g., as a receiver) to receive energy released by nuclei in the sensed region. As shown, one or more components can be eccentric such that the NMR unit can have an orientation with respect to the sensed region, which can be a portion of a wall of a borehole.

In the example of FIG. 9, the tool 950 can include one or more features such as a stabilizer, a pad, a turbine, etc. As shown, the tool 950 includes the NMR unit 970, for which an approximate cross-sectional view along a line A-A is shown. In the cross-sectional view, the NMR unit 970 is shown to include the magnets 972, the antenna 974 and circuitry 980, which can include RF emission circuitry, antenna circuitry and analog-to-digital conversion circuitry (e.g., an analog-to-digital converter (ADC)). As an example, the NMR unit 970 can include one or more passages for one or more conduits. For example, consider a power conduit, a data transmission conduit, a power and data conduit, etc. As an example, the tool 950 can include a power source or be operatively coupled to a power source, which may be a fluid driven turbine (e.g., turbogenerator, etc.), a surface power source (see, e.g., the logging truck 550, the battery 570, etc.).

As an example, a power source may be a power grid, a generator (e.g., gas, wind, fuel, etc.), a solar panel, a battery, etc.

As to the circuitry 980, it can include one or more processors and memory accessible to at least one of the one or more processors. For example, the circuitry 980 can include a processor that executes instructions that control energy emissions to generate an oscillating magnetic field, as may be according to a programmed pulse sequence. As an example, the circuitry 980 can include one or more switches, which may be operatively coupled to sources of energy, which can include a source to generate pulsed emissions and/or a source that is an antenna or antennas that receive signals from nuclei in a formation. For example, a switch may act to control an antenna to use the antenna for transmission of energy and then to use the antenna for reception of energy. Received energy can be directed to an analog-to-digital converter that can convert analog signals to digital data according to a selected sampling rate and/or bit depth. As an example, the digital data can be stored to memory and optionally processed by the processor (e.g., downhole) and/or transmitted to another processor, storage device, etc., which may be uphole or part of the downhole tool or another downhole tool. As an example, a processor or processors can be configured using executable instructions to perform one or more operations on data such as, for example, inversion to derive one or more values (e.g., $T_2$ values, $T_1$ values, etc.).

As shown in the example of FIG. 9, the circuitry 980 can include a sequencer 982, a transmitter 984, a receiver 986, and an ADC 988. The sequencer 982 can include instructions or otherwise be instructed to control the transmitter 984, which can be operatively coupled to the antenna 974 for transmission of oscillating magnetic fields. The receiver 986 can be operatively coupled to the antenna 974 for reception of echo signals where such signals can be in analog form and converted into digital echo data using the ADC 988. As shown in the example of FIG. 9, other circuitry 989 can be included, which may be operatively coupled to one or more data and/or power lines. For example, consider one or more data and/or power lines operatively coupled to an uphole (e.g., surface) unit or system. As an example, the sequencer 982 may be programmable via instructions, commands, etc., received from memory locally, from a surface unit or system, another component of a downhole string, etc. As an example, a method can include controlling emissions, which may be via RF emission circuitry. As an example, such circuitry can include the sequencer 982 and the transmitter 984 as operatively coupled to the antenna 974. As an example, a method can include acquiring digital echo data, which may be via antenna circuitry and analog-to-digital conversion circuitry. As an example, such circuitry can include the antenna 974, the receiver 886 and the ADC 988. As an example, compression circuitry may be included to compress digital echo data (e.g., consider one or more of window summing, singular value decomposition, etc.). Data compression may reduce data density for transmission of data uphole to a surface unit or system (e.g., via the circuitry 989, etc.).

As an example, the tool 950 can be dimensioned for receipt in a borehole with a diameter of approximately 10 cm or more, which may depend on features such as a centralizer, pads, etc. As an example, the tool 950 can be of a maximum diameter of a tool body of approximately 5 cm or more. For example, consider an outer tool body diameter of approximately 12 cm at a NMR unit (e.g., a NMR unit with a 12 cm cross-sectional dimension).

As an example, a NMR unit can be skid-mounted to cut through mud cake and for contact with a formation. As an example, contact may be enhanced through one or more components such as an eccentralizing arm or power calipers. As mentioned, internal permanent magnets can be utilized to provide a static polarizing magnetic field. As an example, a NMR unit may be sensitive to a volume of about 1 cm to 3 cm or more into a formation where the volume may extend a length of an antenna along a longitudinal axis of the NMR unit (e.g., 5 cm to 15 cm or more), which can be a factor in vertical resolution. As an example, an antenna can be operated as a transmitter, a receiver or both a transmitter and a receiver. As a transmitter, an antenna can transmit a sequence for an oscillating magnetic field (e.g., consider a CPMG pulse sequence, etc.). As a receiver, an antenna can receive pulse echoes from a formation, including substances in the formation such as one or more fluids.

Figure 10:
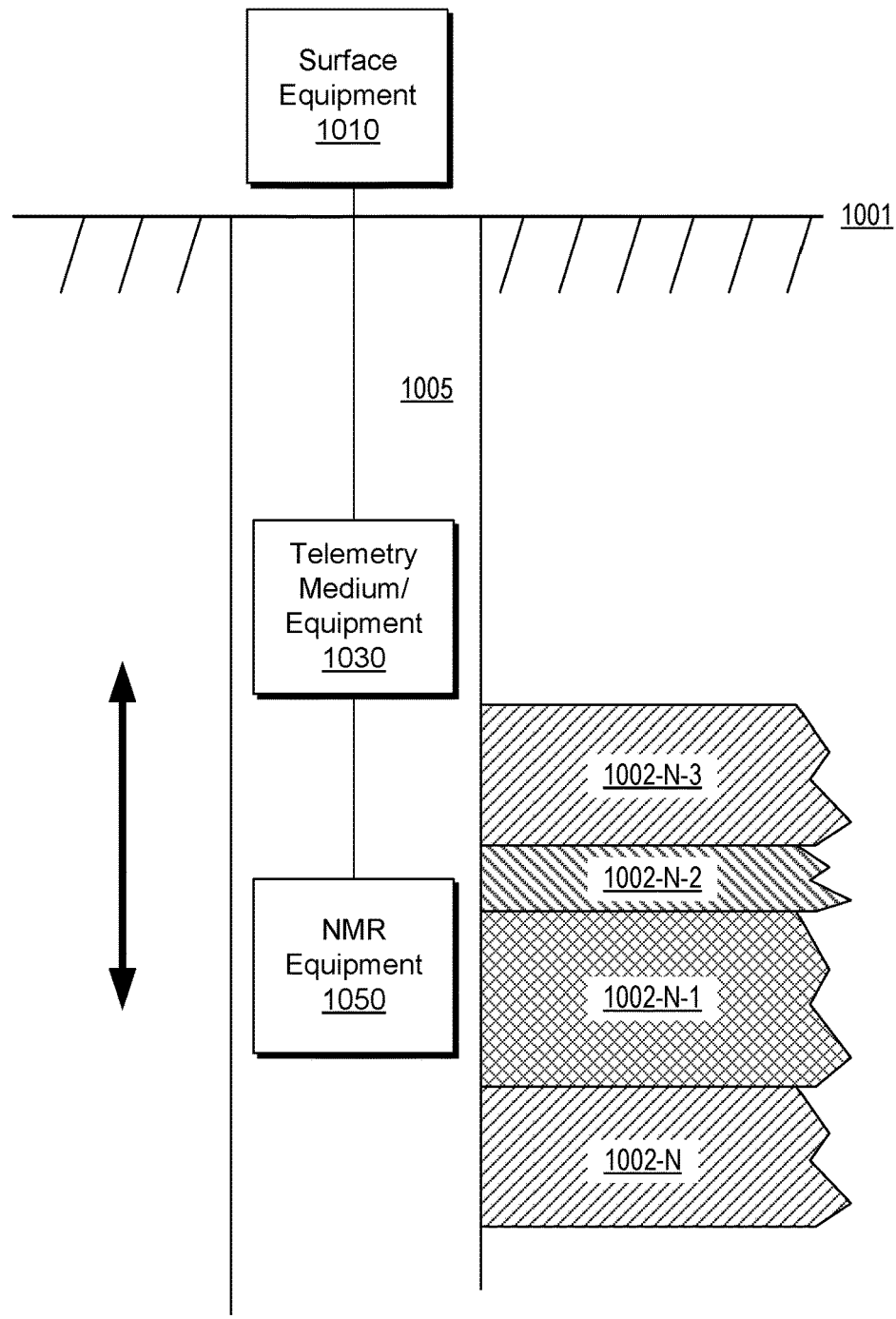
FIG. 10 illustrates an example of a system.

FIG. 10 shows an example of a system 1000 with respect to a subsurface region that includes a surface 1001, various types of formations 1002-N-3, 1002-N-2, 1002-N-1, and 1002-N, which may be referred to as formations 1002 or individually as individual formations, and that includes a borehole 1005 where the formations 1002 define a wall of the borehole (e.g., a borehole wall). As shown in the example of FIG. 10, the formations 1002 can be of different thicknesses, of different materials, and may be disposed at different angles with respect to the surface 1001. As an example, the borehole 1005 may be vertical or deviated. As an example, the borehole 1005 may include a vertical portion and a deviated portion. As an example, in a deviated portion, the borehole 1005 may traverse the formations 1002 in a manner that increases path length such that the path length of the borehole 1005 in each of the formations 1002 is greater than the thickness of each of the formations 1002.

As shown in the example of FIG. 10, the system 1000 includes surface equipment 1010, telemetry medium and/or equipment 1030 and NMR equipment 1050. As explained, whether the system 1000 includes drilling equipment or logging equipment, the NMR equipment 1050 can move in the borehole 1005. For example, the NMR equipment 1050 can be tripped in, move with drilling, tripped out, maintained at a stationary position, etc. As to movement of the NMR equipment 1050, it may be referenced with respect to spatial coordinates, which may provide for a measured depth and/or a vertical depth. As an example, movement along the borehole 1005 can be characterized with respect to velocity, acceleration, translation, vibration, rotation, etc.

In the example of FIG. 10, the NMR equipment 1050 can be operated to acquire NMR data for the different formations 1002. Where the formations 1002 differ in their materials (e.g., types of materials, composition of materials, etc.), the NMR equipment 1050 may operate more efficiently when an acquisition protocol is matched to one or more formation characteristics. For example, formation characteristics may result in different relaxation time constants (e.g., $T_1$ and/or $T_2$). In such an example, an acquisition protocol for a slow $T_2$ (e.g., AP1) may differ from an acquisition protocol for a fast $T_2$ (e.g., AP2). In such an example, if AP1 is applied to a non-optimal formation type (e.g., fast $T_2$), the resulting NMR data may be of lesser quality. For example, the NMR data may be of a lower signal to noise ratio (SNR). As an example, for NMR measurements, an acquisition protocol (AP) may be characterized by a pulse sequence (PS). As an example, the NMR equipment 1050 can include circuitry that can automatically change an AP, which can include changing a PS, which can involve, for example, changing a pulse width (e.g., a duration of a pulse width or durations of pulse widths).

As an example, the NMR equipment 1050 can include one or more optimization algorithms that can be utilized to determine one or more pulse widths (e.g., a duration or durations in microseconds, etc.). As an example, an optimization algorithm may be triggered according to one or more triggering criteria. As an example, a triggering criterion can be a preprogrammed criterion such as, for example, the aforementioned parameter $n_f$, which inserts an optimization pulse sequence into a series of formation characterization pulse sequences where the optimization pulse sequence can be for the purpose of optimizing a pulse width, without providing for a number of repetitions that reduce signal-to-noise ratio to an extent as would be utilized for a series of formation characterization pulse sequences. For example, an optimization pulse sequence can include single instances of specific pulse widths, which may be performed in series or optionally interspersed with one or more formation characterization pulse sequences. Data acquired via the optimization pulse sequence can be analyzed for an optimal pulse width. As explained, a downhole automated calibration scheme can execute an optimization pulse sequence that can be expedient to not occupy a substantial amount of time. For example, consider execution of six spin echo pulse sequences as an optimization pulse sequence where each of the six spin echo pulse sequences utilizes a different pulse width and where signals can be analyzed to determine a pulse width that corresponds to a maximum signal. As another example, a nutation pulse sequence may be utilized that applies a relatively constant RF field interspersed with acquisition periods to acquire signals that can be analyzed with respect to at least a portion of a sine function (e.g., or other appropriate function). As mentioned, an optimization pulse sequence can aim to acquire signals for one or more angles less than 90 degrees and for one or more angles greater than 90 degrees such that a maximum can be determined using sub-maximum signal information to both sides of the maximum.

As an example, the system 1000 can include computational resources that can automatically adjust the NMR equipment 1050, which may be responsive to a formation characteristic, a NMR equipment characteristic, a depth characteristic, a time characteristic, a velocity characteristic, an acceleration characteristic, etc. In such an example, the telemetry medium and/or equipment 1030 may be adjusted. For example, consider an adjustment to telemetry mode, compression of data, organization of data, etc. As an example, an adjustment may be to one or more pulse widths.

As an example, as the NMR equipment 1050 moves in the borehole 1005, the NMR equipment 1050 may be adjusted in real time such that one or more adjustments are made to the NMR equipment 1050 based on one or more characteristics, which may operate as one or more triggers. Such an approach may provide for more efficient operation of the NMR equipment 1050, which may provide improved SNR, improved power utilization, improved telemetry, etc.

As an example, the NMR equipment 1050 can automatically adjust acquisition, for example, by selecting a particular acquisition protocol (AP) from a group of acquisition protocols (APs). As an example, an automatic adjustment may include adjusting one or more parameters of an acquisition protocol (AP).

As an example, the NMR equipment 1050 can include and/or be operatively coupled to a trained machine model that can receive input and generation output. In such an example, the output may be utilized to control operation of the NMR equipment 1050.

As mentioned with respect to FIG. 9, the NMR unit 970 (e.g., NMR equipment) can include the circuitry 980. Such circuitry may be "lightweight". As an example, NMR equipment can include a microprocessor that has associated specifications. For example, consider a microprocessor with a relatively low clock rate (e.g., less than 100 MHz). As an example, NMR equipment can include memory that has associated specifications. For example, consider random access memory (RAM) with a relatively low amount of memory (e.g., less than 10 MB).

Figure 11:
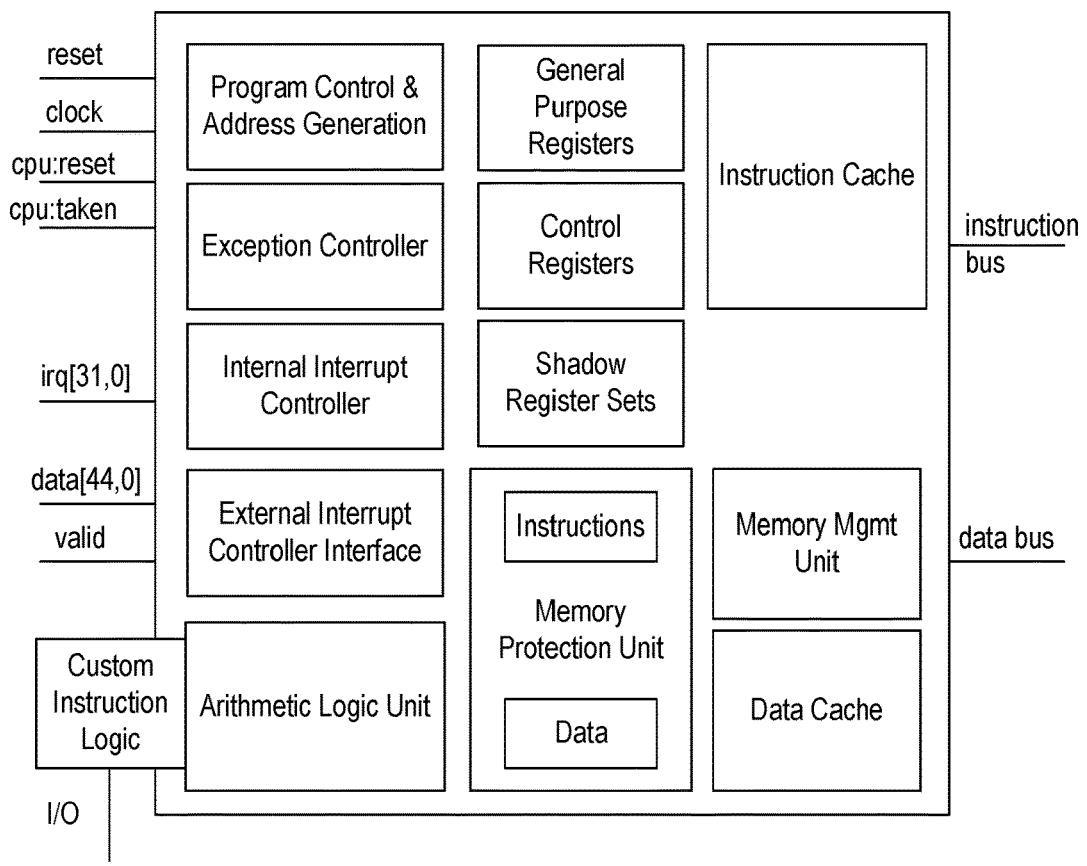
FIG. 11 illustrates an example of a microprocessor and an example of circuitry.
Figure 11:
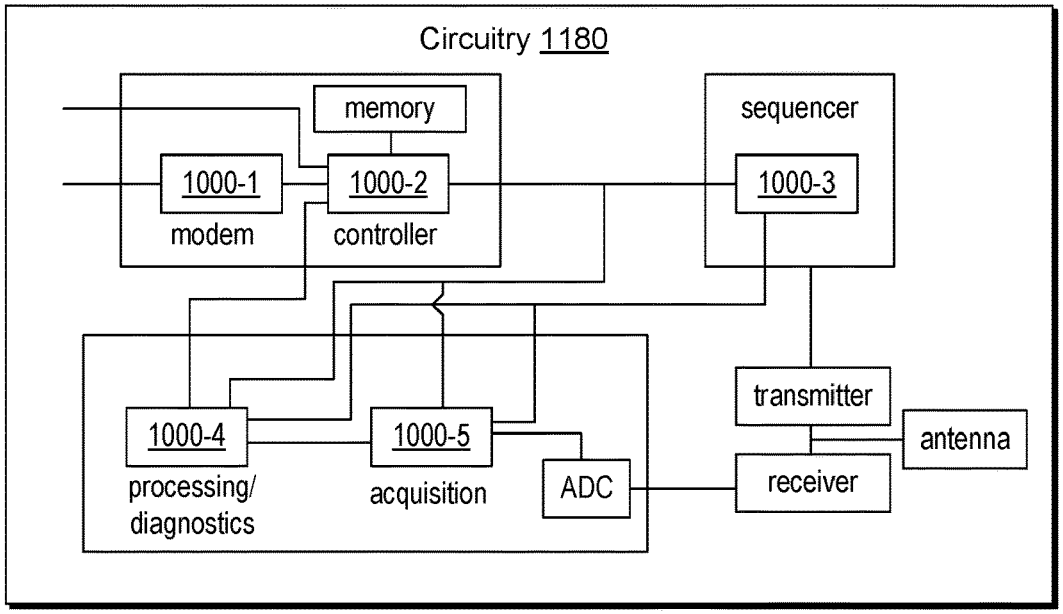

FIG. 11 shows an example of a microprocessor 1100 that may be utilized in a downhole tool such as a NMR unit (e.g., NMR equipment) along with an example of circuitry 1180 that can include a plurality of microprocessors 1100-1, 1100-2, 1100-3, 1100-4, and 1100-5. As shown, the circuitry 1180 can include a modem processor 1100-1, a controller processor 1100-2, a sequencer processor 1100-3, a processing and diagnostics processor 1100-4, and an acquisition processor 1100-5. Also shown in the example circuitry 1180 of FIG. 11 are memory, an ADC, a transmitter, a receiver and an antenna (see, e.g., the circuitry 980 of FIG. 9).

As an example, the microprocessor 1100 can include various features such as registers, cache, memory (e.g., for instructions and data), busses, a clock, address generators, interrupts, logic units, etc. As an example, the microprocessor 1100 can include various features of an INTEL Corporation (Sunnyvale, Calif.) microprocessor such as one or more of the NIOS family microprocessors (e.g., NIOS II, etc.). As an example, a microprocessor such as the microprocessor 1100 may be utilized with and/or include one or more features of a device such as the CYCLONE device (Altera, San Jose, Calif.). For example, a CYCLONE III device can include a NIOS II family microprocessor. The NIOS II family of microprocessors includes a 32-bit embedded-processor architecture designed specifically for the ALTERA family of field-programmable gate array (FPGA) integrated circuits.

A NIOS II processor can include an instruction cache, 60 MHz clock, hardware multipliers, external SRAM (for executable code and data) such as 2 MB on a modem and on a sequencer and 4 MB on a controller along with 8 MB external cache for storing FPGA image and software and a 4 GB recording cache (controller coupled). In such an example, each FPGA can possess "system on a chip" (SoC) characteristics and custom instructions to tailor functionality to the specific portion of circuitry.

Figure 12:
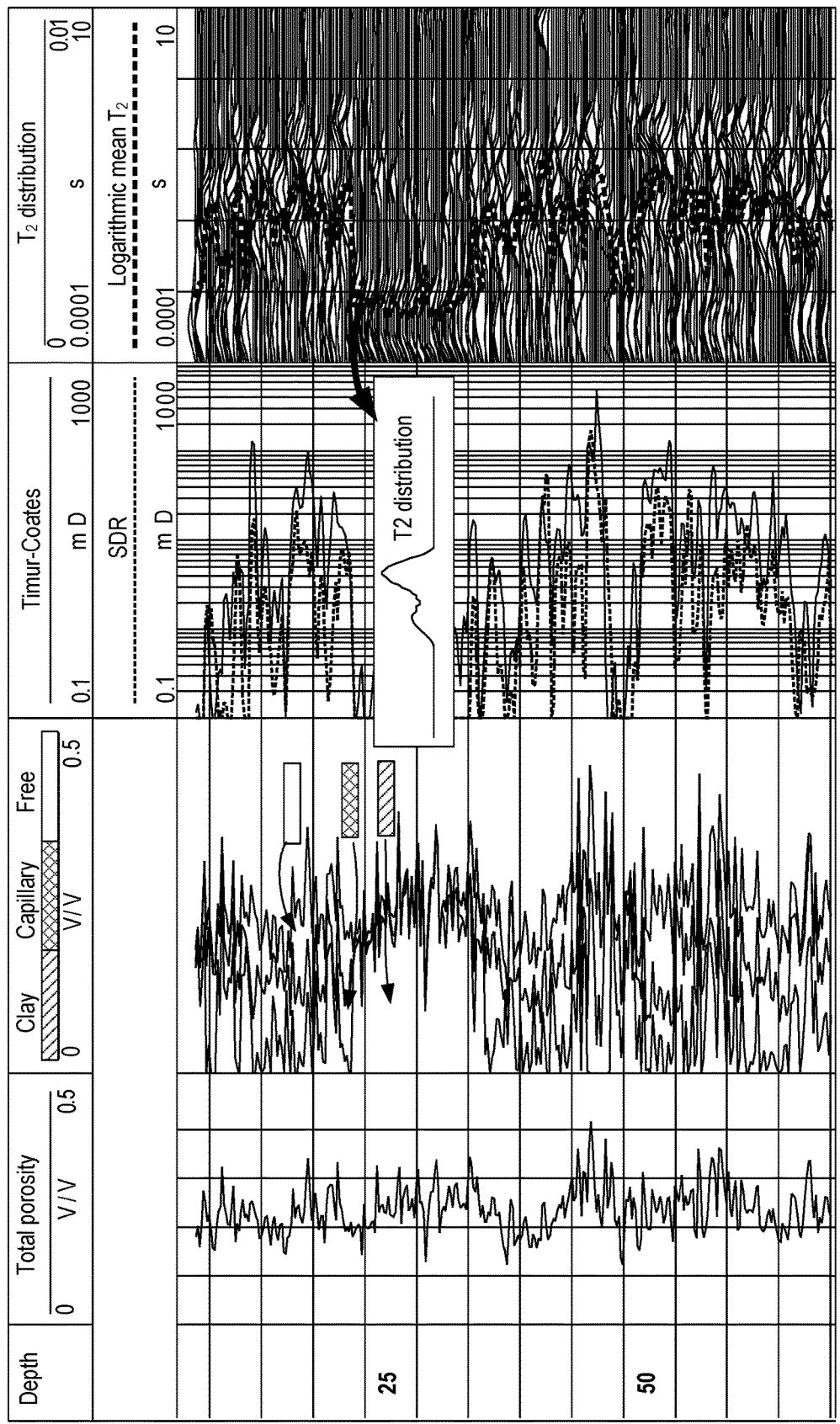
FIG. 12 illustrates an example of a graphical user interface.

FIG. 12 shows an example of a graphical user interface (GUI) 1200 that includes graphics derived from NMR data as acquired by a NMR unit of a downhole tool. The GUI 1200 shows four tracks in log form, with respect to depth and various other scales. The GUI 1200 may include, for example, a gamma ray track, which may help to provide indication of position (e.g., depth, measured depth, etc.). As shown, the first track includes a plot of total porosity (e.g., lithology-independent), the second track includes graphics of volumes of clay-bound water, capillary-bound water, and free fluid derived from a measured $T_2$ distribution, the third track includes permeability estimate graphics as derived using Timur-Coates and Schlumberger-Doll-Research (SDR) permeability equations and the fourth track includes the measured $T_2$ distribution as well as the logarithmic mean $T_2$ values at various depths.

As to depth, indicators as to 25 and 50 are shown, which can be utilized to determine a resolution (e.g., a vertical resolution, which may be with respect to a direction in vertical depth or a direction in measured depth). As may be appreciated, a higher vertical resolution can provide greater insight into characteristics of a formation.

As an example, a tool for NMR can include multiple sensors, including a large antenna for fluid characterization and complementary small aperture antennae for high-resolution acquisition modes. As an example, an automated switching method may optionally include switching of an antenna. As an example, a tool for NMR can include sensors that can be operated either separately or simultaneously at various logging speeds. For example, consider a tool that can operate at logging speeds up to 1,000 meters per hour or more. As an example, a tool for NMR can provide for analyses of responses for high-resolution identification of long $T_1$ fluids such as light hydrocarbons.

As to logging speed, consider the logging truck 550 of FIG. 5 as including a reel (e.g., a wireline reel, coiled tubing reel, etc.) that can be rotated by a motor to cause the logging string 540 to translate in the openhole section 528, which can be directional such as toward the end of the borehole (inwardly) or toward the surface of the borehole (outwardly). Such directional movement may be referred to as tripping in or tripping out. The logging speed can depend on the type of pulse sequence utilized for NMR and/or a switching method may include selecting a pulse sequence using one or more motion signals, etc. As an example, a pulse sequence that takes more time can result in slower logging speeds while a sequence that takes lesser time may result in faster logging speeds (e.g., depending on physical constraints of a system, an environment, etc.). In the example of FIG. 5, the logging truck 550 can include the system 560 where the system 560 controls a reel that controls movement of the logging string 540. For example, rotation of the reel can be controlled to achieve a desired logging speed of the logging string 540. As an example, logging may occur with continuous motion or with starts and stops. As an example, a logging speed may be an average speed that includes time(s) associated with one or more stop/start cycles.

As an example, a downhole automated calibration scheme may be adjusted and/or triggered by motion of a tool. For example, consider the parameter $n_I$ as being utilized to determine where an optimization pulse sequence is to be interspersed with respect to pulse sequences of a downhole acquisition scheme. As an example, where tool acceleration increases, as may be indicated by an accelerometer, the parameter $n_I$ may be decreased as conditions may be expected to change more rapidly when a tool is accelerating. And, for example, where tool acceleration decreases, the parameter $n_I$ may be increased as conditions may be expected to change less rapidly. As mentioned, one or more other factors may be utilized such as, for example, temperature, antenna Q-factor, etc., to adjusted and/or trigger a downhole automated calibration scheme.

Referring again to the GUI 1200 and the fourth track, $T_2$ distributions are illustrated graphically for a series of depths. The GUI 1200 shows a single $T_2$ distribution amplified to demonstrate that $T_2$ values can have a peak or peaks for a volume of investigation at a particular depth. As an example, a higher vertical resolution can provide for more $T_2$ distributions over a particular segment of a borehole. As an example, a sequence that can be executed in lesser time with acceptable data quality can provide for a greater logging speed, which may allow for receiving data for a segment of a borehole in a shorter period of time (e.g., more rapid formation evaluation, etc.). As an example, a downhole automated calibration scheme may place relatively insubstantial demands on time, while being able to assure higher signal strength via optimization of pulse(s).

As an example, a method can include various parameters such as a speed parameter, a number of NMR measurements at different depths per unit time parameter, a sequence duration parameter, a maximum speed parameter as to NMR measurements, a maximum speed parameter as to physical constraints on a logging tool and/or a logging system, a maximum data rate or bit rate for transmission of data from a downhole tool, a maximum processing rate as to processing of data (e.g., downhole and/or uphole), etc.

Figure 13:
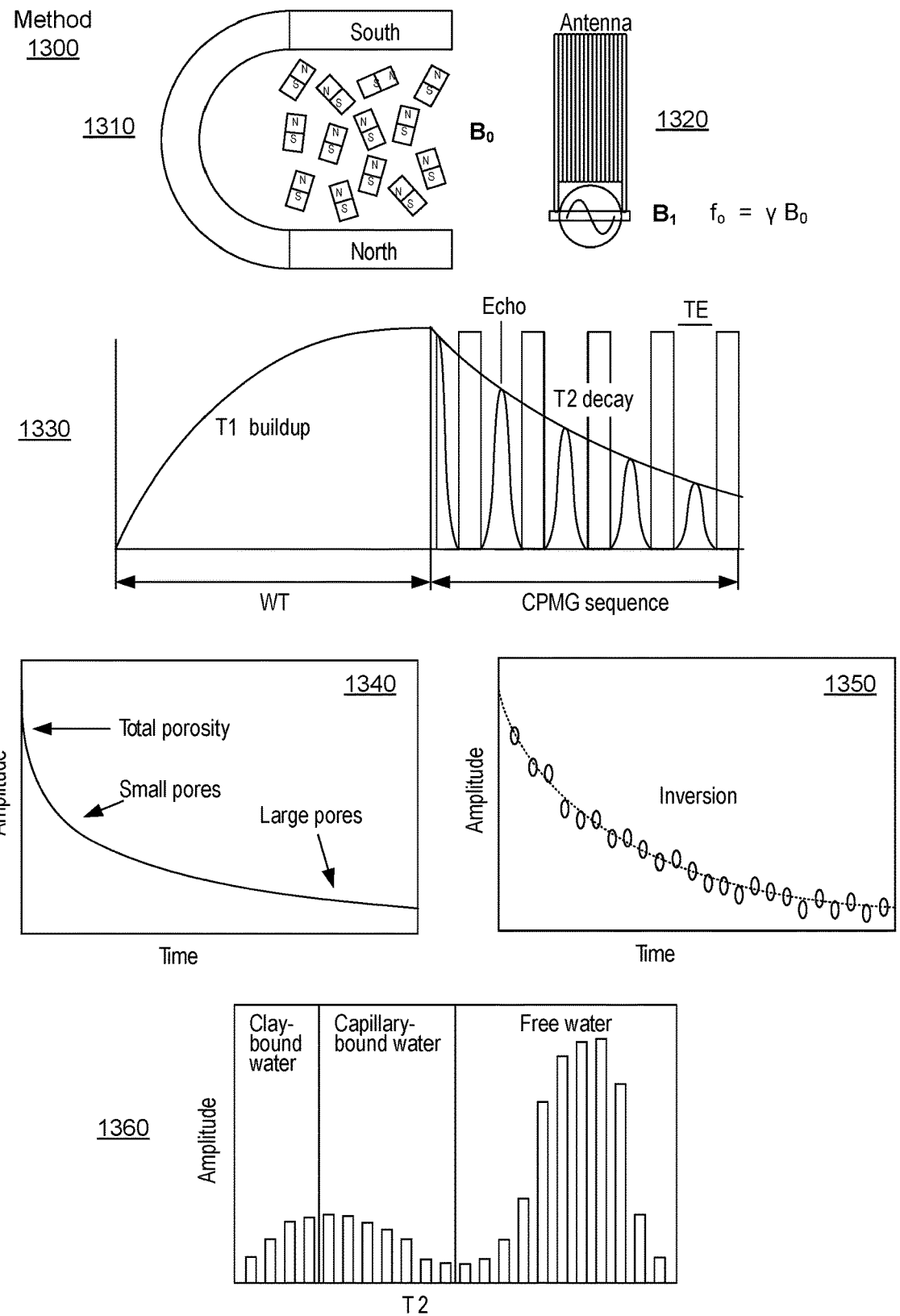
FIG. 13 illustrates an example of a method.

FIG. 13 shows an example of a method 1300 that includes various actions along with approximate graphical representations. The method 1300 includes an exposure block 1310 for exposing nuclei to a static magnetic field, an exposure block 1320 for exposing the nuclei to an oscillating magnetic field, a sequence block 1330 for performing the exposing according to a pre-determined sequence that includes data acquisition, an analysis block 1340 for analyzing at least a portion of acquired data, an inversion block 1350 for inverting at least a portion of the acquired data converts a decay curve into a distribution of $T_2$ measurements and an analysis block 1360 for analyzing a distribution of $T_2$ measurements with respect to porosity (e.g., pore sizes in the formation investigated), which can correspond to water environments (e.g., clay-bound water, capillary-bound water, free water, etc.).

As explained, hydrogen nuclei ($^1H$) behave like tiny bar magnets and tend to align with the magnetic field of permanent magnets, such as those in an NMR logging tool. During a set wait time (WT), the nuclei polarize at an exponential buildup rate, $T_1$, including multiple components (C). Next, a train of RF pulses can adjust spins of the hydrogen nuclei causing them to tip 90 degrees and then precess about the permanent magnetic field, as mentioned, 180 degree pulses can re-focus the hydrogen nuclei at particular times. The formation fluids can generate RF echoes responsive to successive 180 degree pulses where the RF echoes are received and measured by the antenna of the NMR logging tool. The time between the 180 degree pulses can be defined as the echo spacing or echo time. The amplitudes of the echoes decay at a superposition of exponential relaxation times, $T_2$, which tend to be functions of pore-size distribution, fluid properties, formation mineralogy and molecular diffusion. As an example, an inversion technique can be applied that converts a decay curve into a distribution of $T_2$ measurements (see, e.g., $T_2$ distribution of the GUI 1200 of FIG. 12). In general, for brine-filled rocks, the distribution is related to the pore sizes in the rocks.

As an example, an approach can utilize a system that is distributed, for example, a system that utilizes a combination of high-performance computing (HPC) and edge computing infrastructures for automating and optimizing logging operations, where data acquisitions are dynamically adjusted with an incremental knowledge of a reservoir. An adaptive approach can be utilized with an aim to improve efficiency and quality of data acquisition and to automate job planning.

As mentioned, a downhole tool can include a NMR unit that can utilize one or more types of pulse sequences to acquire measurements. Various pulse sequences include a 90 degree pulse (T90) that aims to maximize signal from a sample. However, achieving an accurate 90 degree pulse can be challenging, particularly given conditions experienced in downhole NMR logging. As mentioned, one condition can be temperature, which may change over time due to one or more factors (e.g., movement of fluid, heat transfer, movement of a downhole tool, etc.). For example, consider the NMR unit 970 of FIG. 9 where the shape and/or strength of the $B_0$ field can change with respect to temperature.

Figure 14:
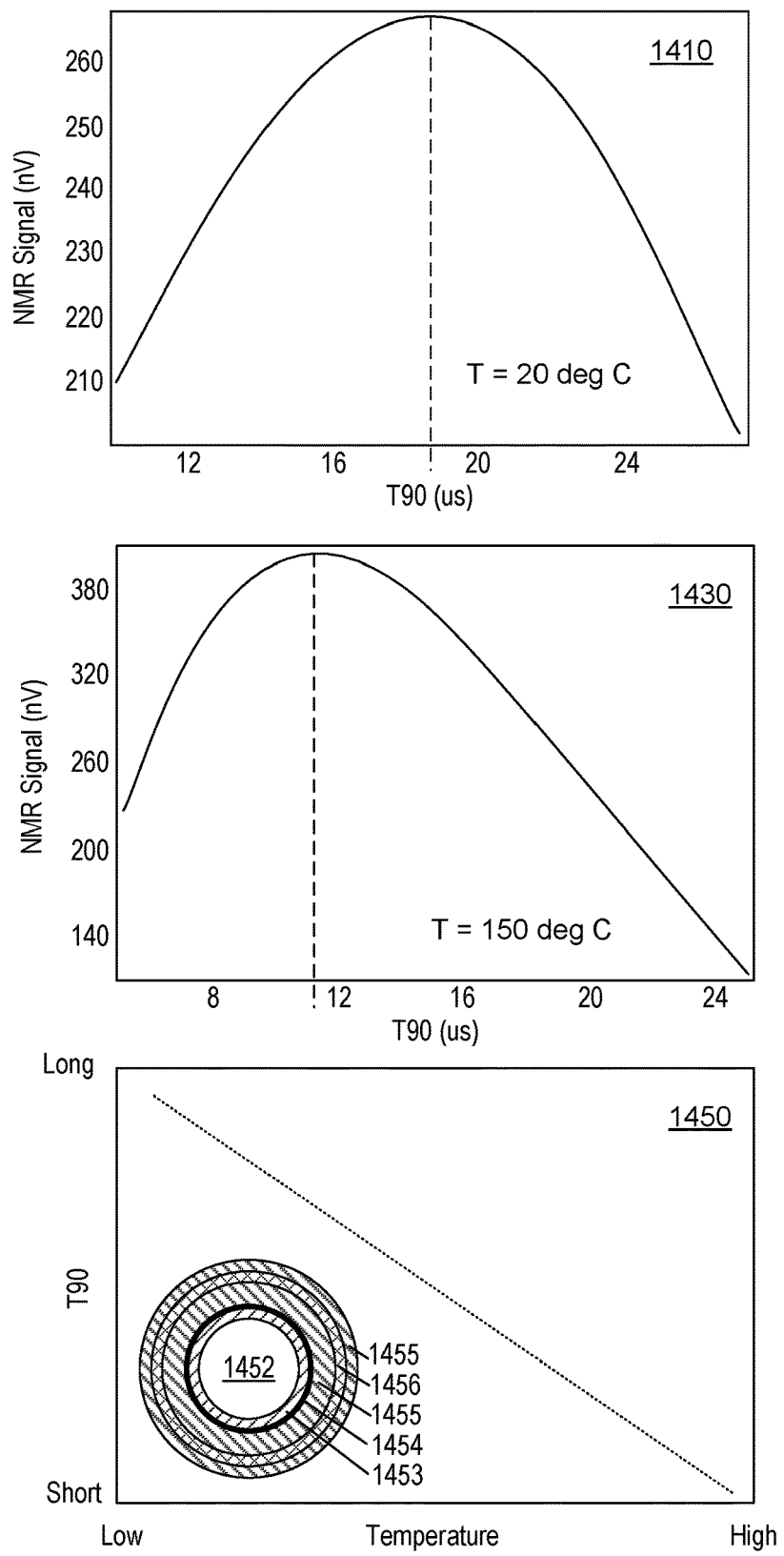
FIG. 14 illustrates example plots.

FIG. 14 shows example plots 1410 and 1430 as to temperature dependence of a 90 degree pulse (e.g., T90) along with an example plot 1450 of pulse width versus temperature and a graphical representation of a downhole environment that includes a NMR tool 1452, surrounding fluid 1453, a bore wall 1454 that defines a borehole, a formation 1455 and a region of investigation (ROI) 1456 that is within the formation 1455, which represented as a circular shell of response in the formation. In the example plot 1450, the relationship between pulse width and temperature can account for the features shown in the graphical representation, which can include features of the NMR tool 1452 as well as the surrounding fluid 1453, the bore wall 1454 (e.g., and optionally mud cake, etc.) and the formation 1455. In the example plot 1450, the relationship shows that as temperature increases the pulse width decreases and, conversely, as the temperature decreases, the pulse width increases. Such a relationship can be due to one or more factors; noting that for a given $B_1$ frequency, the ROI 1456, may change where the $B_0$ static field changes in shape and/or strength with respect to temperature. For example, as temperature of the magnet(s) that produce the $B_0$ static field changes, the ROI for a given $B_1$ frequency may be at a greater radius or at a lesser radius (e.g., consider the Larmor frequency as related to the gyromagnetic ratio and strength of $B_0$). As an example, the plot 1450 may be a model or part of a model that can predict an expected direction and/or amount (e.g., value, percentage, etc.) of change in optimal pulse duration (e.g., for a T90 pulse, etc.) for a given change in temperature. As an example, such an approach may be utilized to expedite setting of an optimal pulse width, which may be experimentally via execution of pulse sequences for one or more pulse widths predicted using, at least in part, information in one or more plots such as one or more of the plots 1410, 1430 and 1450.

Specifically, the data in the plots 1410 and 1430 are for a logging-while-drilling (LWD) NMR tool at two different temperatures, 20 degrees C. and 150 degrees C. As shown, T90 has an optimal value of approximately 19 microseconds at 20 degrees C. and a shorter optimal value of approximately 11 microseconds at 150 degrees C. As shown in the plots 1410 and 1430, the NMR signal can be measured in nanovolts (nV), where the signal amplitude may also depend on temperature.

As the strength of the static magnetic field ($B_0$) from a tool's magnets depends on temperature, as explained with respect to the $B_0$ field 975 of FIG. 9 and as explained with respect to the graphical representation in the plot 1450, the position of the ROI can shift relative to the tool thus resulting in a change in the value of $T90_{opt}$. In LWD NMR tools, changes in temperature can occur for various reasons, which can depend, for example, on drilling, flow of drilling fluid, flow of cuttings, etc. Furthermore, the effective $B_1$ also depends on conductivity of the environment surrounding the antenna, which is typically dominated by the drilling fluid properties (e.g., mud properties). In the case of a conductive mud (e.g., a highly saline brine), the effective $B_1$ is lower than in the case of resistive muds (e.g., a fresh water mud or an oil base mud). The $T90_{opt}$ values can therefore change with the mud properties.

As mentioned, a downhole automated calibration scheme may be adjusted and/or triggered based at least in part on temperature. For example, a temperature sensor can be operatively coupled to a NMR tool where temperature data acquired by the temperature sensor can be utilized to adjust and/or trigger execution of an optimization pulse sequence. In such an example, the optimization pulse sequence can utilize a number of pulse widths where the number and/or the values of the pulse widths can be determined at least in part using temperature data. For example, where temperature increases, the pulse widths can be determined to include a range that encompasses more values that are less than the current pulse width of the acquisition pulse sequence as, per the data of FIG. 14, the optimal pulse width for a 90 degree pulse is shown to decrease with increasing temperature.

As an example, a method can include generating a model of pulse width versus temperature for a NMR tool and utilizing the model to determine a range of pulse widths to be utilized in an optimization pulse sequence. For example, where a temperature change is from 100 degrees C. to 140 degrees C., a range of pulse widths may be determined using the model and a current pulse width where, for example, the current pulse width may be considered a largest pulse width value that is likely to be sub-optimal; yet, such a value may be utilized in a fitting process to identify a signal maximum that corresponds to an optimal pulse width. In such an example, temperature can be utilized to trigger an adjustment and to tailor an optimization pulse sequence such that the optimization pulse sequence has a greater likelihood of finding the optimal pulse width. Such an approach may be referred to as a biased approach where a temperature-pulse width model provide a bias such that the optimization pulse sequence does not utilize pulse widths that are likely to contribute little to finding the optimal pulse width. Such an approach can conserve time and energy when compared to an approach that unbiasedly selects a range equally above and below a current pulse width.

While the foregoing example mentions temperature to introduce a bias as to a range of pulse width values, one or more other factors may be utilized to introduce a bias. As an example, one or more models may be utilized that can bias a range of pulse width values for an optimization pulse sequence. As an example, a method can include detecting a change in a condition, selecting a model corresponding to that condition, assessing the selected model with respect to the change, and selecting a range of pulse width values that are biased according to the model and the change. Such a method can further include executing an optimization pulse sequence that utilizes the range of pulse width values where signals acquired are analyzed to determine an optimal pulse width value (e.g., $T90_{opt}$). As an example, where conditions change in a manner where one change is likely to drive an increase in pulse width and another change is likely to drive a decrease in pulse width, models can be utilized to determine respective ranges (e.g., biased ranges) where the ranges may be combined in one or more manners (e.g., summed, offset, unioned, etc.) to arrive at a range of pulse width values to be utilized in an optimization pulse sequence.

Where a NMR tool does not include an ability to optimize pulse width, the actual T90 pulse width used during logging is kept fixed at the $T90_{opt}$ values defined during a pre-logging optimization procedure (e.g., a PWO algorithm or tool characterization). In a pre-logging approach, the calibration algorithm developed during tool characterization aims to implicitly account for the effect of non-optimal T90 values across expected environmental conditions. For example, if a logging operation (e.g., logging with or without drilling) is expected to encounter a temperature range of 100 degrees C. to 130 degrees C., the $T90_{opt}$ may be set to a value that is greater than approximately 11 microseconds yet less than approximately 16 microseconds (see, e.g., the plots 1410 and 1430 of FIG. 14).

Operation of the tool with T90 and T180 different from its optimal values can dramatically increase sensitivity of NMR measurements on $B_0$ and $B_1$/T90 variability. In other words, by operating at optimal T90 and/or T180, sensitivity of NMR measurements on $B_0$ and $B_1$/T90 variability can be decreased (e.g., operation can be made more robust, more accurate, etc.).

Figure 15:
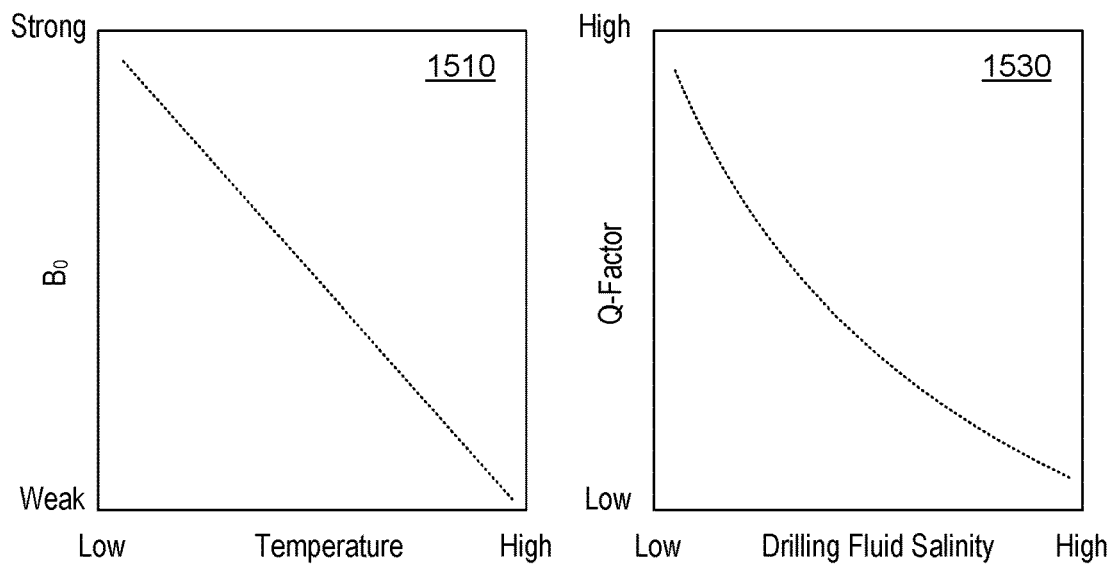
FIG. 15 illustrates example plots.
Figure 15:
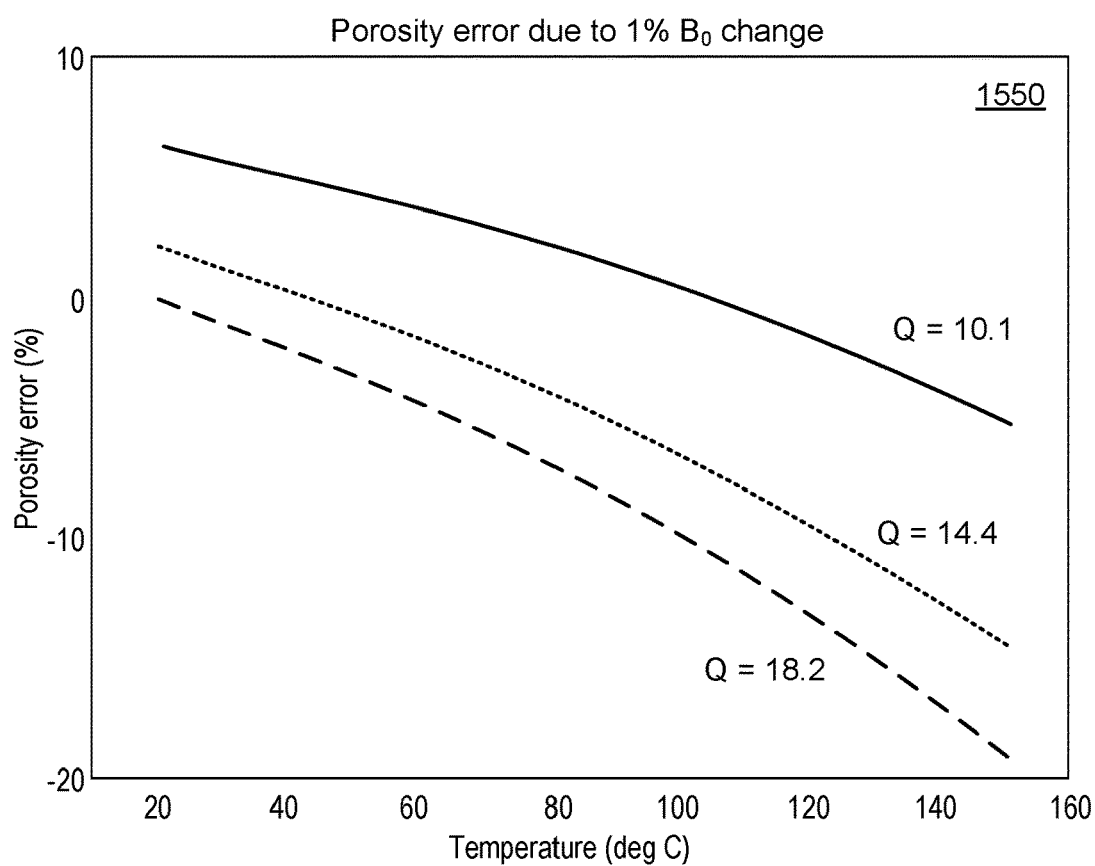

FIG. 15 shows example plots 1510, 1530 and 1550. The plot 1510 shows a relationship between static field strength $B_0$ of a NMR tool with respect to temperature where an increase in temperature decreases the static field strength $B_0$. The plot 1530 shows a relationship between Q-factor and drilling fluid salinity (e.g., mud salinity) where an increase in drilling fluid salinity decreases the Q-factor. As an example, the information in the plots 1510 and/or 1530 may be utilized to define a predictive model or predictive models, for example, optionally in combination with information as in FIG. 14. For example, a change in drilling fluid salinity, which may be measured downhole and/or at surface (e.g., at a mud tank, a mud pipe, etc.), may cause a change in an antenna's Q-factor. As an example, a NMR tool may be triggered to measure a Q-factor of an antenna. As an example, a change in salinity can cause a change in conductivity in a downhole environment, which can result in a change in pulse width. As an example, a change in conductivity may be indicated via one or more of a salinity measurement and a Q-factor measurement. As an example, a change in a pulse width may occur for a change in conductivity. As an example, a method can include triggering a downhole optimization scheme responsive to an indication that a change in conductivity has occurred (e.g., via a change in Q-factor, a change in measured conductivity, which may be via salinity, etc.). As an example, a model may predict a direction in which a pulse width is expected to occur for one or more changes in one or more conditions in a downhole environment (see, e.g., the graphical representation in the plot 1450).

In FIG. 15, the plot 1550 shows porosity error due to a 1 percent change in $B_0$ in a tool to tool comparison where the first tool is properly characterized while the second tool is using the first tool characterization curve. As can be discerned, a calibration of one tool may not be appropriate for another tool. Such a type of error can be larger (e.g., greater than 1 percent, more than 5 percent, more than 10 percent, etc.), which may depend on temperature (e.g., larger with increasing temperature, etc.) and antenna Q-factor. Practically, characterization of individual tools on a tool-by-tool basis can present challenges. For example, such an approach may depend on operators at a tool site, equipment at a tool site, etc., and/or may increase production time for manufacturing where characterization may change depending on conditions, aging, etc., of a manufactured tool.

In the plot 1550 of FIG. 15, the porosity error is show to also depend on Q-factor where the error may be greater with respect to a temperature range for a greater Q-factor. As shown, the Q-factor value of 18.2, over the range from 20 degrees C. to 150 degrees C., has an error range from 0 percent porosity error to approximately minus 20 percent porosity error. In contrast, the Q-factor value of 10.1, over the range from 20 degrees C. to 150 degrees C., has an error range from approximately 6 percent porosity error to approximately minus 5 percent porosity error. As an example, information as in the plot 1550 may be utilized to define a model or models that can be utilized by a NMR tool to adjust and/or optimize a pulse width. In such an example, a method may aim to improve characterization of a formation (see, e.g., the graphical representation in the plot 1450), which may include characterization with respect to porosity and/or a physical parameter of a formation that depends on porosity.

Figure 16:
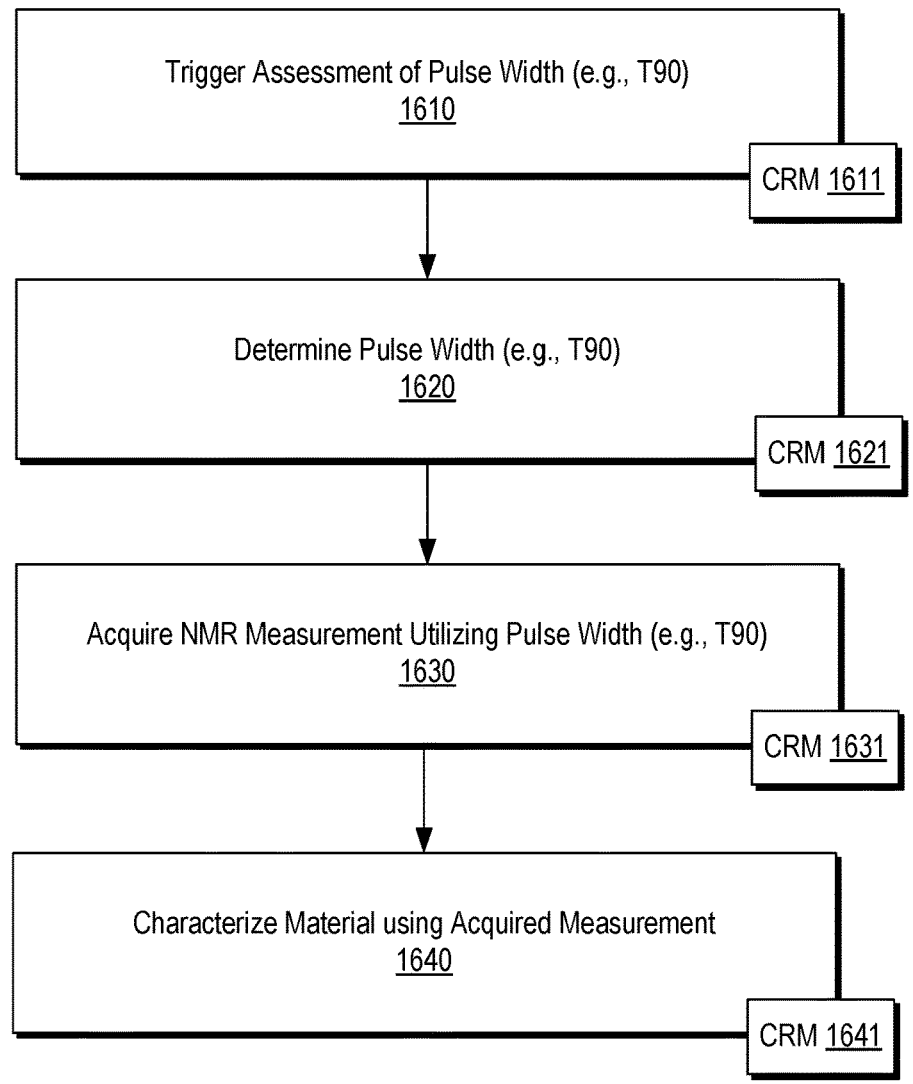
FIG. 16 illustrates an example of a method and an example of a system.
Figure 16:
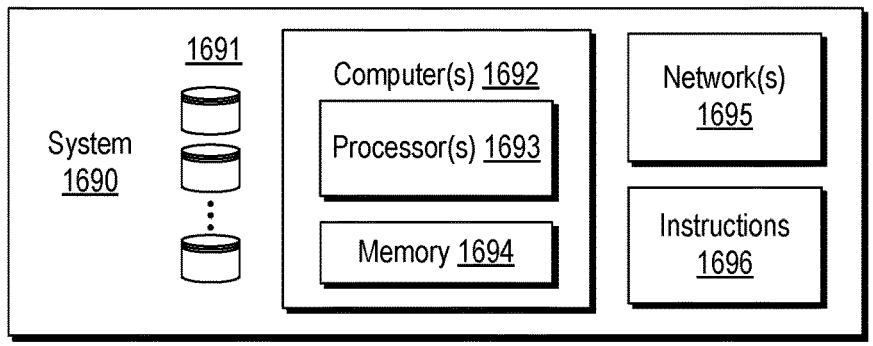

FIG. 16 shows an example of a method 1600 and an example of a system 1690. As shown, the method 1600 can include a trigger block 1610 for triggering an assessment of pulse width (e.g., T90); a determination block 1620 for determining a pulse width; an acquisition block 1630 for acquiring measurement(s) utilizing the determined pulse width; and a characterization block 1640 for characterizing material using the acquired measurement(s).

The method 1600 of FIG. 16 is shown as including various computer-readable storage medium (CRM) blocks 1611, 1621, 1631, and 1641 that can include processor-executable instructions that can instruct a computing system, which can be a control system, to perform one or more of the actions described with respect to the method 1600. As an example, the circuitry 980 and/or the circuitry 1180 may be utilized to perform one or more of the actions described with respect to the method 1600.

As shown in the example of FIG. 16, the system 1690 can include one or more computers 1692 that include one or more processors 1693, memory 1694 operatively coupled to at least one of the one or more processors 1693, instructions 1696 that can be, for example, stored in the memory 1694, and one or more interfaces 1695. As an example, the system 1690 can include one or more processor-readable media that include processor-executable instructions executable by at least one of the one or more processors 1693 to cause the system 1690 to perform actions such as, for example, one or more actions of the method 1600. As an example, the instructions 1696 can include instructions of one or more of the CRM blocks 1611, 1621, 1631, and 1641. The memory 1694 can be or include the one or more processor-readable media where the processor-executable instructions can be or include instructions. As an example, a processor-readable medium can be a computer-readable storage medium that is non-transitory that is not a signal and that is not a carrier wave.

As an example, the system 1690 can include subsystems. For example, the system 1690 can include a plurality of subsystems that may operate using equipment that is distributed. For example, consider a downhole tool subsystem and a surface subsystem as described with respect to FIG. 10. As an example, operations of the blocks 1610, 1620 and 1630 of the method 1600 may be performed using a downhole tool subsystem. As an example, operation(s) of the block 1640 may be performed using a downhole subsystem and/or a surface subsystem, which may be a cloud-based or cloud-coupled subsystem. As an example, the downhole tool 950 of FIG. 9 can include one or more of the one or more processors 1693, the memory 1694 operatively coupled to at least one of the one or more processors 1693, and instructions 1696 that can be, for example, stored in the memory 1694.

As to the trigger block 1610 of the method 1600 of FIG. 16, a trigger may be a sensor-based trigger that utilizes data acquired via one or more sensors. As mentioned, temperature, Q-factor, drilling fluid properties, flow of fluid, etc., can be sensed using one or more types of sensors. As an example, temperature can be sensed using a temperature sensor (e.g., thermocouple, a resistance thermometer, a thermistor, a silicon bandgap temperature sensor, etc.). As an example, Q-factor can be sensed using circuitry of an NMR tool. As an example, drilling fluid properties can be sensed using downhole and/or surface equipment (e.g., viscometer, hydrometer, resistivity meter, conductivity meter, salinity meter, etc.). As an example, flow of fluid can be sensed using downhole and/or surface equipment (e.g., flowmeter, pressure meter(s), etc.). As mentioned, one or more models may be utilized to predict one or more pulse width values, which may be biased (e.g., model-biased values).

As mentioned, the Q-factor of an antenna can be defined as a measure of the bandwidth of the antenna relative to the center frequency (e.g., resonant frequency) of the bandwidth. If the antenna operates over a band between frequencies $f_1$ and $f_2$ with a center frequency $f_c=(f_1+f_2)/2$, then the Q-factor may be given as $(f_c/(f_2-f_1))$. As mentioned, the Q-factor may be defined in terms of energy (e.g., the ratio of energy stored in an oscillating resonator to energy dissipated per cycle by damping processes).

Antennas with a high Q-factor may be classified as narrowband; whereas, antennas with a low Q-factor may be classified as wideband. As an example, a higher Q-factor can mean that the antenna input impedance is more sensitive to small changes in frequency.

As an example, the method 1600 may be implemented to characterize a tool with respect to pulse width using one or more variables, such as, for example, one or more of temperature antenna Q-factor. Such an approach can make the tool less sensitive to $B_0$, $B_1$/T90 variability and may allow for use of a single characterization algorithm for a group of different tools.

As an example, the determination block 1620 of the method 1600 may utilize one or more techniques to determine a pulse width or pulse widths. For example, consider an approach that accesses a database that can determine a pulse width for a given temperature and/or for a given Q-factor. In such an example, the data in the database, which may be pulse width data, may be determined prior to a logging operation. For example, a tool algorithm may be executed to populate data in a database that can then be accessed during a logging operation.

As mentioned, a method may utilize one or more models, as explained, for example, with respect to FIGS. 14 and 15. As an example, the determination block 1620 of the method 1600 may utilize one or more models to determine a pulse width or pulse widths. As an example, a model may be a tabulated model that can be stored as a data structure in memory of a NMR tool (e.g., consider a look-up table (LUT)). As an example, a model can be a numerical model with one or more parameters. For example, consider a linear model, a non-linear model, etc. As an example, a model may be a multi-dimensional model. For example, consider a model that includes dimensions for two or more of temperature, static field strength ($B_0$), salinity (e.g., or conductivity) and Q-factor (e.g., or another antenna characteristic).

As an example, a method may utilize a nutation pulse sequence where a duty cycle may be utilized interspersed with signal acquisition to determine data sufficient to perform a Fourier transform on the data, which can then be utilized to determine an optimal T90 (e.g., and/or T180, etc.). As mentioned, the nutation approach depends on a Fourier transform of a full sine wave, which demands an amount of data that spans a sufficient portion of a full sine wave.

As an example, a method may utilize a spin echo pulse sequence (or spin echo sequence) that is repeated using different pulse width T90 values that are sufficient to determine a peak in signal amplitude that corresponds to an optimal T90 pulse width. In such an example, a range of pulse widths may be determined and a number of spin echo sequences executed, for example, one sequence per pulse width or multiple sequences per pulse width (e.g., to reduce noise via averaging, etc.). In such an approach, amplitude data may be fit to a model (e.g., a sine wave, a portion of a sine wave, etc.), to determine a maximum amplitude value and a corresponding optimal T90 pulse width.

In the spin echo sequence approach, a current T90 pulse width may be utilized to determine a range of pulse widths to execute. For example, consider using the current T90 pulse width as an approximate center value and a range of values below and a range of values above. In such an example, the aim may be to acquire amplitude values that are below T90 optimal and above T90 optimal such that a portion of a sine wave can be fit. As mentioned, an approach may utilize a biased approach, for example, where a model or models are utilized to bias a range with respect to a current T90 pulse width.

As an example, rather than, or in addition to, a current T90 pulse width, a method can include accessing a database to select a condition-based (or conditions-based) estimated T90 pulse width. For example, referring to the plots 1410 and 1430 of FIG. 14, where an increase in temperature occurs, rather than using a current T90 pulse width (e.g., directly), a method can utilize a lesser T90 pulse width value (e.g., current T90 pulse width minus an amount that can depend on a temperature difference, etc.) as a center value from which ranges may be determined for execution of a spin echo sequence to determine an optimal T90. As an example, a current pulse width may be utilized to delimit a range, etc. As an example, where a decrease in temperature occurs, rather than using a current T90 pulse width (e.g., directly), a method can utilize a greater T90 pulse width value (e.g., current T90 pulse width plus an amount that can depend on a temperature difference, etc.) as a center value from which ranges may be determined for execution of a spin echo sequence to determine an optimal T90. In such an example, a current pulse width may be utilized to delimit a range, etc.

As an example, the method 1600 may be executed in a manner that aims to conserve time and/or energy (e.g., energy of a tool, etc.). As to the approach of using a spin echo sequence, consider utilizing five spin echo sequences that are centered about an estimate of an optimal T90 where five data points are generated as a result for amplitude versus pulse width, which can be fit to a model (e.g., a portion of a sine wave, etc.) to determine an experimentally determined optimal T90 (e.g., $T90_{opt}$). In such an example, the total execution time may be relatively short (e.g., of the order of a few seconds or less). Further, such an approach may be implemented in a manner that does not involve having to set a duty cycle as with the nutation approach, which may allow for circuitry of a downhole tool to experience less non-productive time (NPT), as may be associated with swapping out one algorithm for another type of algorithm. For example, where the CPMG pulse sequence is being utilized, a spin echo sequence to determine $T90_{opt}$ may be implemented by adjusting several parameters of the CPMG pulse sequence algorithm; whereas, the nutation approach may not be compatible with the CPMG pulse sequence algorithm.

As an example, a method such as the method 1600 of FIG. 16 may operate in a tiered manner. For example, as mentioned, a database may be accessed to determine an estimated $T90_{opt}$ or one or more models, which may be followed by execution of a spin echo sequence to determine an experimental $T90_{opt}$. Such an approach may help to minimize risk of execution of the spin echo sequence where the maximum is outside of the range of pulse widths. As mentioned, an approach may utilize a multiplication factor to adjust a current T90 pulse width, where a relationship (or relationships) may be known to some degree a priori as to direction (e.g., shorter or longer) and amount by which the current T90 pulse width may be expected to have changed.

As an example, a tool may include an extended portion that extends in a direction downhole away from a NMR antenna where the extended portion may include one or more sensors that can sense one or more conditions, which may be utilized to trigger an assessment, trigger a determination, etc., as to a T90 pulse width. For example, consider a temperature sensor that is more than one meter away from a NMR antenna where a temperature at the NMR antenna can be compared to a temperature measured by the temperature sensor, which may be utilized to determine a temperature differential, a trend in temperature, etc. Such temperature data can be utilized to trigger an assessment of a T90 pulse width and/or to determine a T90 pulse width (e.g., via a database, via determining an estimated T90 pulse width range that is likely to include a $T90_{opt}$, etc.).

Figure 17:
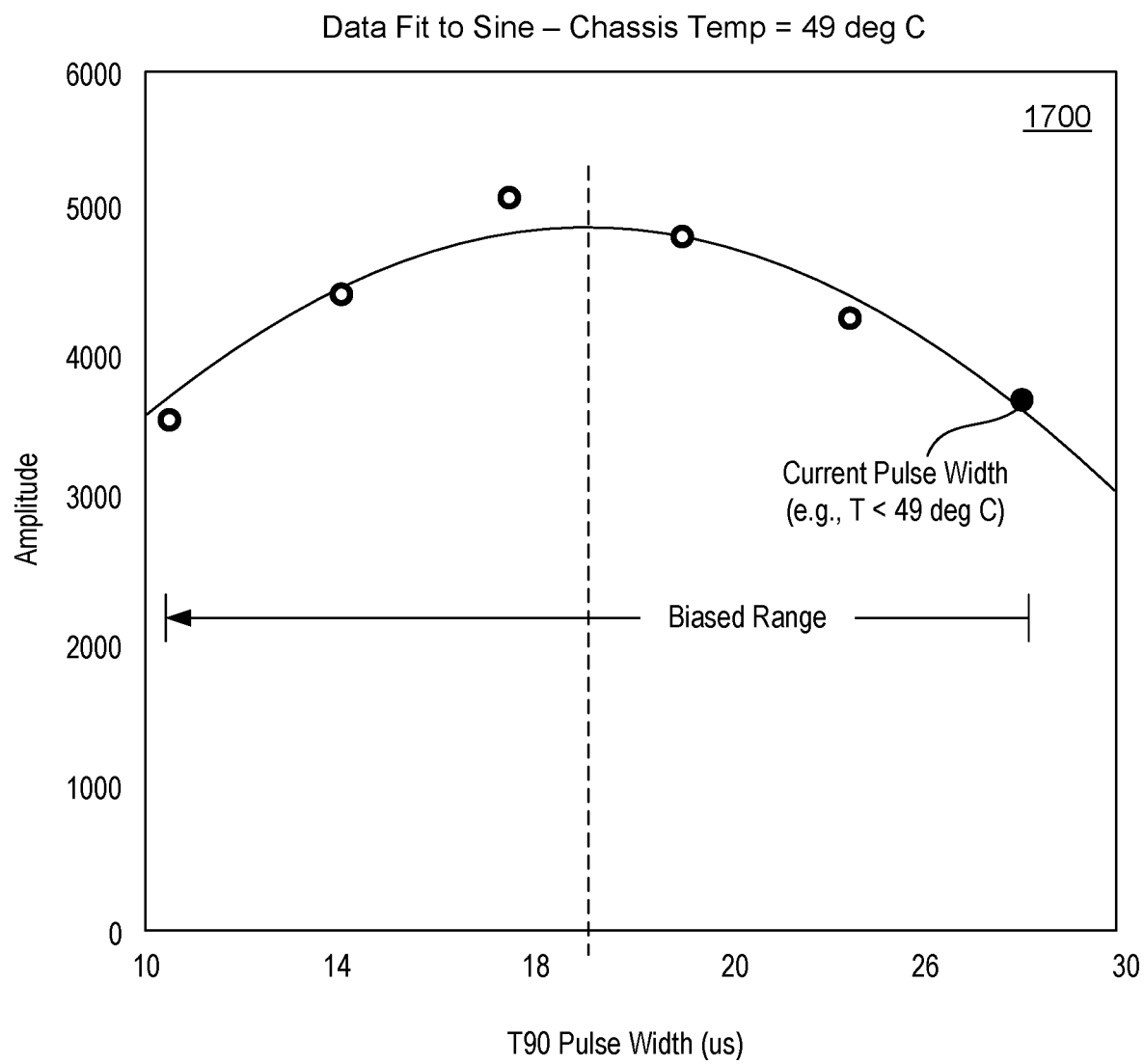
FIG. 17 illustrates an example of a plot and example of a method.

FIG. 17 shows an example of a plot 1710 of a spin echo sequence approach to determining $T90_{opt}$. The plot 1710 includes amplitude versus pulse width data in microseconds where a sine function has been fit to six data points and where the sine function includes a maximum value in amplitude at a particular T90 pulse width value. In the example of FIG. 17, the $T90_{opt}$ is approximately 18 to 19 microseconds. As shown, the sine function can be utilized to determine a range of angles that include 90 degrees. For example, the pulse width of approximately 10 microseconds may correspond to approximately 80 degrees while the pulse width of approximately 28 microseconds may correspond to approximately 100 degrees.

In the example of FIG. 17, a scenario can be for a change in temperature, for example, from a temperature that is less than 49 degrees C. to a temperature of 49 degrees C. In such an example, the current pulse width may be approximately 28 microseconds and a temperature biased range can be determined based on the temperature change being from a lower temperature to a higher temperature, which, per a model, can indicate that the optimal pulse width is likely to be less than the current pulse width. As shown in the example of FIG. 17, a method can include determining a biased range and utilizing the biased range where the biased range includes pulse width values that are less than the current pulse width value such that an optimization pulse sequence does not expend time or energy on pulse width values that are likely to be at a greater distance from the optimal pulse width value than the current pulse width value; noting that one or more values may be at a greater value, being less than the optimal pulse width value. In such an example, if the biased range does not include the optimal pulse width value as indicated by a maximum in signal, then one or more additional pulse width values may be determined, for example, for an altered range. For example, consider the maximum being at a pulse width value greater than the current pulse width value, which may be indicated by the fit sloping upwardly to the current pulse width value with respect to increasing pulse width values. In such an example, that type of fit may indicate that some other factor or factors have changed that overcome the expected model-based trend for temperature. In such an example, memory of an NMR tool can store conditions, which may be analyzed to determine what factors may have contributed to an optimal pulse width being in a direction from a current pulse width that differs from a model-based direction.

As an example, a method can include storing sine function fits (e.g., fit parameters) in a database of a downhole tool. In such an example, the stored sine function fits may be stored with respect to values of one or more conditions such as, for example, temperature, Q-factor, drilling fluid properties, measured depth, total vertical depth, etc. In such an example, where one or more of the conditions occur subsequently, the downhole tool may access the database to determine an estimated $T90_{opt}$, which may be utilized directly and/or for experimental determination of a pulse sequence based $T90_{opt}$.

As an example, in the instance that a spin echo sequence over a range of pulse widths does not result in a local maximum with decreasing values side to side, a method can include fitting or using a fit to estimate what pulse width may be at the maximum. For example, consider the data of the plot 1710 of FIG. 17 where a range of 21 to 30 microseconds was utilized, which did not capture the maximum. In such an example, a sine function fit may be utilized to estimate a value of the maximum and one or more additional spin echo pulse sequences executed that include at least one pulse width value that is less than the estimated value of the maximum. While a sine function is mentioned, as an example, one or more other types of functions may be utilized (e.g., spline, etc.), which can determine a maximum (e.g., as a derivative approaching zero, etc.).

As an example, a method can include performing a search or searches, which may occur iteratively. For example, consider executing a spin echo sequence using a first pulse width and a second pulse width where a slope of amplitude is determined and analyzed to determine whether the amplitude is increasing or decreasing with respect to pulse width duration. In such an example, the third pulse width can be determined such that the amplitude data is more likely to include a maximum when fit. In such an example, a spin echo sequence may be expedited such that time and/or energy are conserved during a logging operation.

As an example, a method may include using an appended spin echo sequence that helps to determine an optimal T90 pulse width. For example, consider executing a CPMG pulse sequence where a spin echo sequence with a different T90 pulse width is included (e.g., at an end of the CPMG pulse sequence). In such an example, a comparison may be made between amplitude of the CPMG pulse sequence and amplitude of the appended spin echo sequence where, if the amplitude of the appended spin echo sequence is greater than the amplitude of the CPMG pulse sequence, an assessment may be triggered (see, e.g., the trigger block 1610 of the method 1600) to determine an optimal T90 pulse width for the CPMG pulse sequence.

As an example, a method can include executing a measurement sequence with several T90/T180 values, which may optionally be appended to another NMR acquisition sequence. As an example, where a $T90_{opt}$ has been determined, a $T180_{opt}$ may be double the $T90_{opt}$ value.

As an example, a spin echo sequence amplitude may be used to determine an adjustment for transforming measured echo amplitudes of a NMR acquisition to equivalent amplitudes that would be obtained if the optimal T90/T180 was used for the current downhole conditions. For example, the amplitudes for sub-optimal pulse width may be adjusted with knowledge of maximum amplitudes for optimal pulse width. In such an example, consider a factor or percentage that can be utilized and applied to adjust one or more amplitudes, which may then be processed, for example, to determine one or more parameters that can characterize a formation, etc. (e.g., $T_2$, etc.).

As an example, a spin echo sequence may be used as input to update actual T90 and/or T180 values used for a NMR acquisition. In such an example, a tool may dynamically adjust T90 and/or T180 values during logging. Such an approach may act to dynamically maximize signal/noise and minimize sensitivity to environmental variations. Such an approach can lead to improved precision and improved accuracy.

Figure 18:
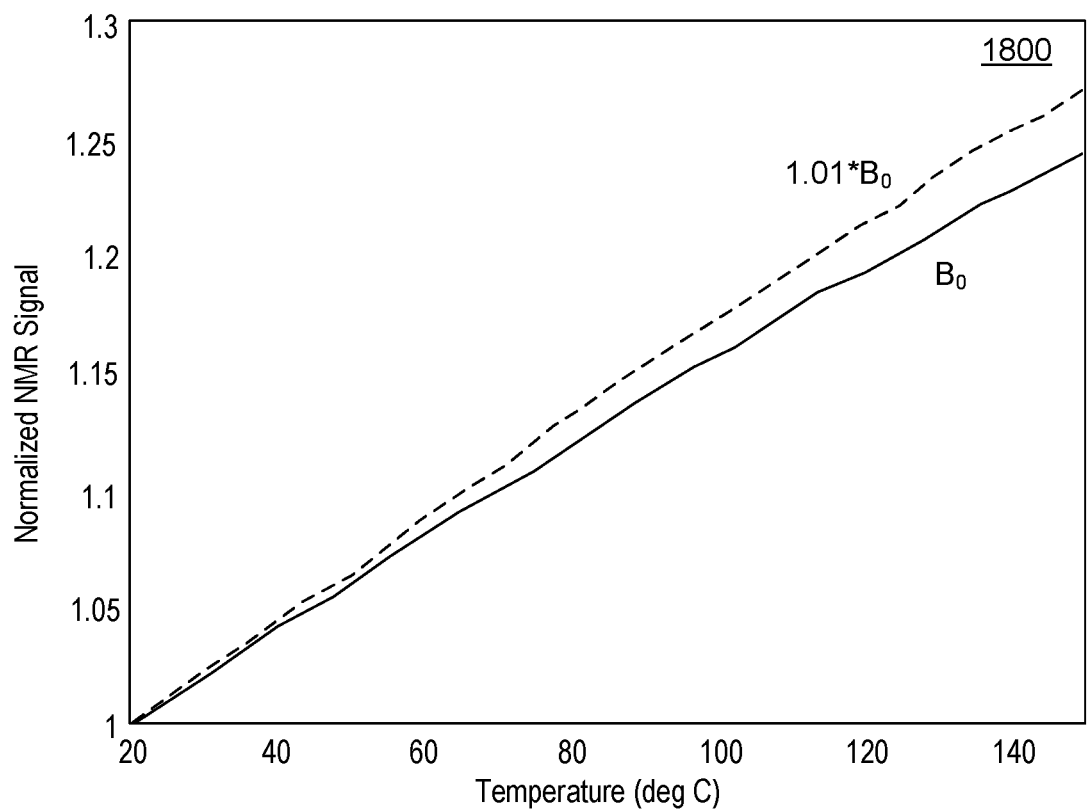
FIG. 18 illustrates an example of a plot.

FIG. 18 shows an example plot 1800 of normalized NMR signal versus temperature for two different static magnetic fields, labeled $B_0$ and $1.01*B_0$. Such data indicate that different $B_0$ values (e.g., different by one percent), as may occur from tool to tool, can result in different signal versus temperature curves (e.g., or lines). In the plot 1800, the difference between curves is less than approximately 2 percent up to approximately 150 degrees C. A method such as the method 1600 of FIG. 16 can allows for characterization for different tools, optionally dynamically during a logging operation.

As explained, NMR logging can face various challenges such as one or more of the three challenges described below. First, it tends to be slow due to real world physics, specifically, the prolonged time to polarize hydrogen atoms in a static magnetic field; second, it tends to have poor SNR owing to the intrinsically weak coupling between nuclear spins and the instrument detectors; and third, an NMR logging program tends to demand substantial job planning, demanding local knowledge and domain resources and resulting in a lengthy operational workflow. Methods that reduce logging time, enhance SNR, and streamline job design are generally desirable. As an example, a method such as the method 1600 of FIG. 16 can help to decrease time and increase precision and accuracy.

As mentioned, the method 1600 of FIG. 16 can provide for characterization of one or more formations (see, e.g., the block 1640). As an example, such a method may aim to characterize one or more aspects of a formation, which can be a porous formation. NMR relaxation such as measured by $T_2$ has been shown to be directly proportional to the surface-to-volume ratio of a porous material, $$1/T_2 = \rho \cdot S/V_p \quad (1)$$

where S is the total surface area of the material, Vp is the pore volume, and $\rho$ is the surface relaxivity.

Above, surface relaxivity $\rho$ is a quantity (in units of micron/second) that defines the strength of the surface relaxation phenomenon. Because of this relationship, NMR is used in petroleum exploration to obtain estimates of porosity, pore size, bound fluids, permeability, and other rock and fluid properties (e.g., "petrophysical data"). For example, it is known that a $T_2$ distribution is closely related to the pore size distribution. Reservoir rocks often exhibit a wide range of $T_2$s due to the difference in pore sizes, with observed $T_2$ from several seconds down to tens of microseconds. Signals at long $T_2$ (e.g., greater than 100 milliseconds) tend to be from large pores and such fluids may be considered producible. For shorter $T_2$ signals (e.g., 3 milliseconds to 50 milliseconds), the fluids are often considered to be bound by capillary force of the pores. For example, fluids in sandstone rocks with $T_2$ below 30 ms are considered bound by capillary force and tend not to produce. Thus, a cutoff value, $T_2$ cut (e.g., $T_2$ cut=30 ms) can be used to calculate the bound fluid volume:

$$BFV = \int_{T_2min}^{T_2cut} f(T_2) dT_2 \quad (2)$$

where $f(T_2)$ is the $T_2$ distribution, and $T_2$ min is the minimum $T_2$ obtained in the $T_2$ distribution.

For a fully saturated sample, porosity ø can be obtained by integrating f(T$_2$) through the entire T$_2$ domain as:

$$\text{ø} = \int_{T_2 min}^{T_2 max} f(T_2) dT_2 \tag{3}$$

where T$_2$max is the maximum T$_2$ exhibited in the sample. Signals with even shorter T$_2$ (e.g., T$_2$ less than approximately 3 milliseconds) can be due to clay bound water or viscous (heavy) hydrocarbon (see, e.g., the plot 1360 of FIG. 13). Some rocks contain a substantial amount of kerogen that is solid organic matter and may exhibit T$_2$s down to tens of microseconds.

As explained, NMR measurements can be acquired using specially designed data acquisition schemes (e.g., pulse sequences) which describe the timings of transmission and reception of electromagnetic signals. A pulse sequence for the measurement of T$_2$ relaxation time distribution can be a CPMG echo train (see, e.g., FIG. 7).

The CPMG echo train includes an initial idle time or wait time (WT) to allow the nuclei in formation fluids to reach equilibrium in the magnetic field produced by the permanent magnet of a logging tool. Thereafter, a set of RF pulses is applied, delivered by an antenna, which, as explained, can include a 90 degree pulse where an optimal 90 degree pulse can be desirable for purposes of maximizing signal (e.g., consider precision and accuracy, etc.). As explained, midway between two RF pulses, NMR signals (e.g., echoes) are formed and may be received by the same antenna (e.g., via a switch, etc.). As explained, the amplitude of the echoes attenuates over time. As explained with respect to FIG. 7, by fitting the echo amplitudes to a multi-exponential model, the T$_2$ distribution, f(T$_2$), may be obtained. Where an optimal 90 degree pulse is utilized, according to an optimal T90 pulse width, the T$_2$ distribution can be more precise and accurate. In turn, a formation can be characterized with greater precision and accuracy.

In such an experiment, a train of echo signals is acquired. The signal amplitude, D, can be measured as a function of the echo time, t$_{echo}$, (the time of the echo from the beginning of the first 90 degree pulse), $$t_{echo} = n*TE \tag{4}$$

where n is the number of echo and TE is the echo spacing (e.g., the time between two adjacent 180 degree pulses). The signal amplitude then follows an exponential decay form, $$D(t_{echo}) = S(0) \exp\left(-n * \frac{TE}{T_2}\right) \tag{5}$$

for a sample of a single T$_2$.

For samples embodying a range of T$_2$ distribution, the total signal is a sum of T$_2$ components, $$D(t_{echo}) = \int dT_2 f(T_2) \exp\left(-n * \frac{TE}{T_2}\right) \tag{6}$$

where f(T$_2$) is the T$_2$ distribution. In practice, fluid properties other than T$_2$ are measured by a wide variety of pulse sequences. For example, relaxation time T$_1$ is measured through inversion or saturation recovery pulse sequences, and translational diffusion coefficient, D, is measured by diffusion-editing or pulse-field gradient pulse sequences.

As an example, a tool can include components that provide it with the capability to reconfigure in real time as it senses a changing environment. Such a tool may provide for intelligent in-time PHM (prognostic health management), for example, by determining how the tool performs in different environments.

As an example, a NMR logging job can be divided into three distinct phases. A first phase can involve job planning, which demands a highly trained expert, such as a domain champion or a seasoned petrophysicist, spending a few hours to days running reservoir models and iterating until a satisfactory measurement protocol is generated. During that phase, many decisions are made based on prior experience or educated guesses. Once generated, a measurement protocol can be loaded and calibrated with the tool.

In a second phase, downhole job execution occurs where the NMR unit runs the protocol through an entire logging interval. While a reduced dataset may be available in some instances (e.g., where telemetry is available) as a relatively continuous stream for real time inversion and answers to product extraction at the surface, a full data stack is generally unavailable during the downhole logging operation.

After the downhole logging job execution occurs and the tool is brought to surface, one or more full datasets can be retrieved from tool memory and analyzed using an appropriate framework (e.g., TECHLOG framework, etc.). Such a framework can be used to provide answer products for delivery to a client (e.g., a logging job client).

An NMR measurement protocol tends to be optimal for a particular logging job and the degree of optimality depends on knowledge of conditions, material types, etc., downhole, as well as an instrument's operating envelop. Executing one protocol through an entire job tends to result in tool underutilization, often yielding suboptimal data and/or prolonged operating time. Where job planning is flawed, due to operator error, inaccurate reservoir modeling, or another unforeseen factor, bad data are a common result. Furthermore, the domain knowledge, extracted from the datasets and answer products, is largely captured in the minds of experts, rather than in a digital format that is both quantifiable and scalable.

As an example, a method such as the method 1600 of FIG. 16 can provide for dynamic adjustments to a logging operation such that NMR data are measured with greater precision and accuracy. Such an approach may, for example, conserve time and/or energy.

As an example, a method can include triggering an assessment of pulse width of an X degree pulse of a downhole NMR tool; responsive to the assessment, determining an optimal pulse width of the X degree pulse; acquiring NMR measurements using the downhole NMR tool and the optimal pulse width; and characterizing a formation using at least a portion of the NMR measurements. In such an example, the X degree pulse can be a 90 degree pulse or, for example, a 180 degree pulse, a 270 degree pulse or a 360 degree pulse.

As an example, a method can include triggering via receiving data from at least one sensor. In such an example, consider data that includes temperature data. As an example, data can include Q-factor data of an antenna of a downhole NMR tool. As an example, data can include time series data. For example, consider temperature versus time, Q-factor versus time, etc. As an example, data can include depth series data. For example, consider temperature versus depth, Q-factor versus depth, etc. As an example, data can include motion data such as, for example, fluid motion data, tool motion data, etc. As an example, a fluid motion sensor (e.g., a flow meter) may provide data that can trigger an assessment. As an example, a tool motion sensor (e.g., an accelerometer, a reel sensor, etc.) may provide data that can trigger an assessment.

As an example, a method can include determining the optimal pulse width of an X degree pulse via accessing a model stored in memory of a downhole NMR tool where the model predicts trends in X degree pulse width values with respect to at least one condition. For example, consider the plots 1410 and 1430 of FIG. 14, where data therein may be utilized to define a model. For example, consider a linear or non-linear model that is fit to the data in the plots 1410 and 1430 such that trends in optimal pulse width can be determined (e.g., predicted) with respect to a temperature change.

As an example, a method can include determining a biased range of pulse width values using a model (e.g., or models) and, for example, a current pulse width value. Such a method can include executing an optimization pulse sequence that utilizes at least two pulse width values in the biased range and can include analyzing signal amplitudes acquired using the optimization pulse sequence to determine a maximum signal amplitude that indicates the optimal pulse width. For example, consider using a signal amplitude of a current pulse width value and signal amplitudes of the at least two pulse width values in the biased range to determine a maximum signal amplitude and a corresponding optimal pulse width (e.g., via fitting a function such as a sine function or portion thereof to the signal amplitudes, etc.). While at least two pulse width values is mentioned, for example, consider at least three pulse width values, which may be utilized with or without a signal amplitude of a current pulse width value.

As an example, a method can include utilizing at least a model to determine a range of pulse width values for a spin echo pulse sequence that determines the optimal X degree pulse width downhole, experimentally. In such an example, the spin echo pulse sequence may be appended to another pulse sequence (e.g., a CPMG sequence, etc.). As an example, the spin echo pulse sequence (SE) may be appended as a series for a plurality of pulse width values of the range (e.g., CPMG-SE(pw1)-SE(pw2)-SE(pw3), etc.) or, for example, the spin echo pulse sequence (SE) may be interspersed in an appended manner (e.g., CPGM-SE(pw1)-CPMG-SE(pw2)-CPMG-SE(pw3), etc.). As an example, where a nutation approach (NA) is utilized, it may be executed, for example, as CPMG-NA, where the NA aims to apply a relatively continuous RF field with a duty cycle for acquisition to drive magnetization to at least 90 degrees (e.g., consider beyond 90 degrees to capture a 90 degree peak, etc.).

As an example, a method can include determining the optimal pulse width of a 90 degree pulse by executing a spin echo pulse sequence that determines the optimal 90 degree pulse width downhole, experimentally, for a range of pulse widths that correspond to a lower angle value between 0 degrees and 90 degrees and a higher angle value between 90 degrees and 180 degrees. In such an example, the 90 degree optimal can be estimated using signals from lesser and greater angles. As an example, a method can include fitting a function to at least two spin echo maximum amplitude values for at least two corresponding, different pulse widths. In such an example, the method can include, based at least in part on the fitting of the function, selecting another, different pulse width and executing the spin echo pulse sequence using the selected other, different pulse width. For example, where a maximum may not be evident and where the method aims to search for a pulse width that corresponds to a maximum.

As an example, a spin echo pulse sequence can be appended to a different pulse sequence that is utilized to acquire NMR measurements to characterize the formation. For example, consider the different pulse sequence being a CPMG pulse sequence.

As an example, a method can include triggering via detecting a change in one or more drilling fluid properties, where a NMR tool is in contact with drilling fluid. In such an example, the change in one or more drilling fluid properties can include a change in salinity.

As an example, a method can include determining the optimal pulse width of an X degree pulse by executing a series of pulses according to a duty cycle wherein the series of pulses nutate bulk magnetization to an angle of at least 90 degrees. In such an example, the X degree pulse may be a 90 degree pulse or, for example, a 180 degree pulse, a 270 degree pulse or a 360 degree pulse.

As an example, a downhole NMR tool can include a processor; memory accessibly by the processor; processor-executable instructions stored in the memory and executable by the processor to: trigger an assessment of pulse width of an X degree pulse; responsive to the assessment, determine an optimal pulse width of the X degree pulse; and acquire NMR measurements using the optimal pulse width. In such an example, the X degree pulse can be a 90 degree pulse and the instructions to determine the optimal pulse width of the 90 degree pulse can include at least one of instructions to access a database of the downhole NMR tool as stored in the memory and instructions to execute a spin echo pulse sequence using a number of pulse widths that correspond to a range of angles that include a lower angle that is greater than 0 degrees and less than 90 degrees and an upper angle that is greater than 90 degrees and less than 180 degrees.

As an example, one or more computer-readable storage media can include computer-executable instructions executable to instruct a computing system to: trigger an assessment of pulse width of an X degree pulse of a downhole NMR tool; responsive to the assessment, determine an optimal pulse width of the X degree pulse; and acquire NMR measurements using the downhole NMR tool and the optimal pulse width.

Figure 19:
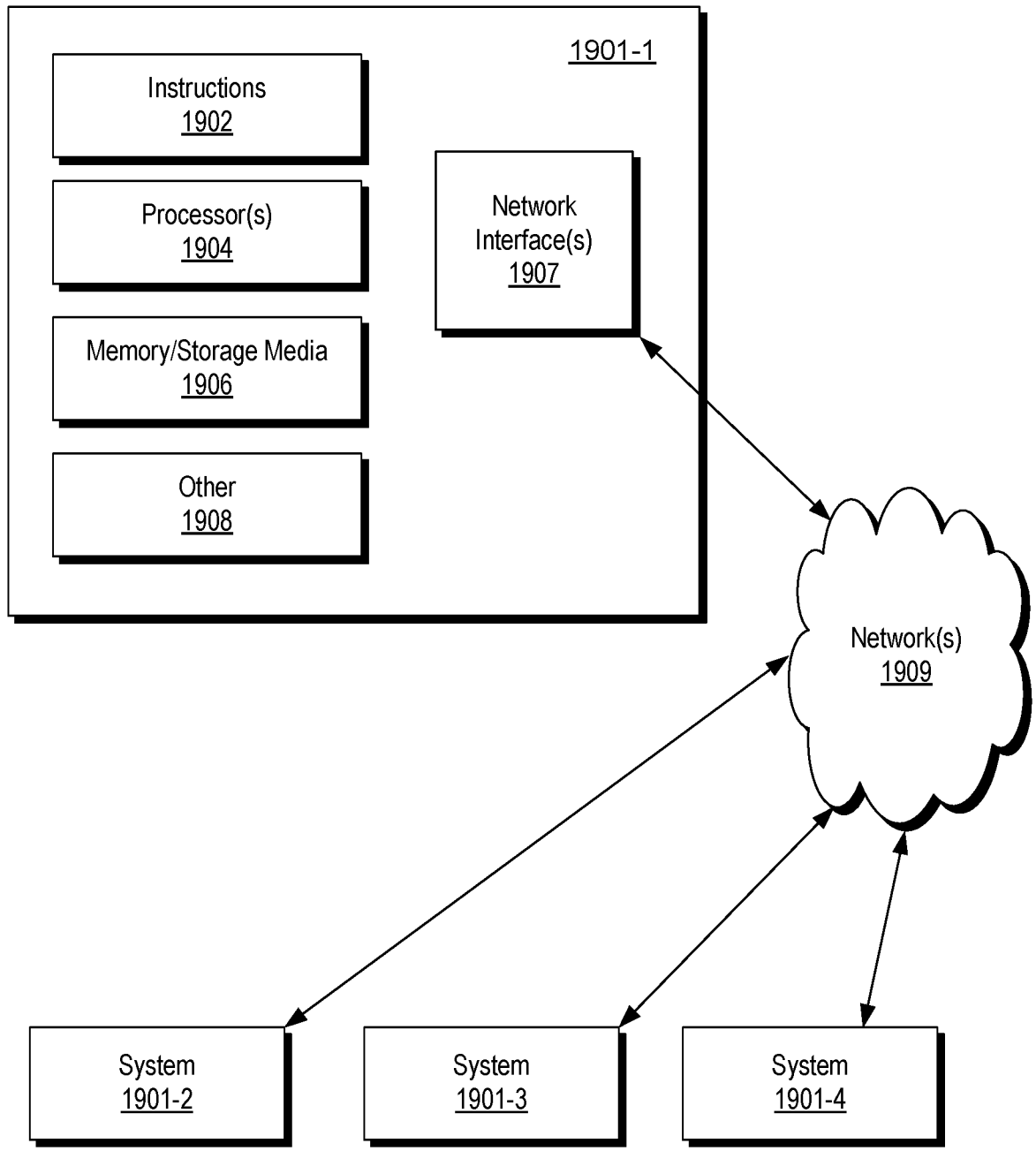
FIG. 19 illustrates examples of computing and networking equipment.

In some embodiments, a method or methods may be executed by a computing system. FIG. 19 shows an example of a system 1900 that can include one or more computing systems 1901-1, 1901-2, 1901-3 and 1901-4, which may be operatively coupled via one or more networks 1909, which may include wired and/or wireless networks.

As an example, a system can include an individual computer system or an arrangement of distributed computer systems. In the example of FIG. 19, the computer system 1901-1 can include one or more sets of instructions 1902, which may be or include processor-executable instructions, for example, executable to perform various tasks (e.g., receiving information, requesting information, processing information, simulation, outputting information, etc.).

As an example, a set of instructions may be executed independently, or in coordination with, one or more processors 1904, which is (or are) operatively coupled to one or more storage media 1906 (e.g., via wire, wirelessly, etc.). As an example, one or more of the one or more processors 1904 can be operatively coupled to at least one of one or more network interface 1907. In such an example, the computer system 1901-1 can transmit and/or receive information, for example, via the one or more networks 1909 (e.g., consider one or more of the Internet, a private network, a cellular network, a satellite network, etc.).

As an example, the computer system 1901-1 may receive from and/or transmit information to one or more other devices, which may be or include, for example, one or more of the computer systems 1901-2, etc. A device may be located in a physical location that differs from that of the computer system 1901-1. As an example, a location may be, for example, a processing facility location, a data center location (e.g., server farm, etc.), a rig location, a wellsite location, a downhole location, etc.

As an example, a processor may be or include a microprocessor, microcontroller, processor component or subsystem, programmable integrated circuit, programmable gate array, or another control or computing device.

As an example, the storage media 1906 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 20:
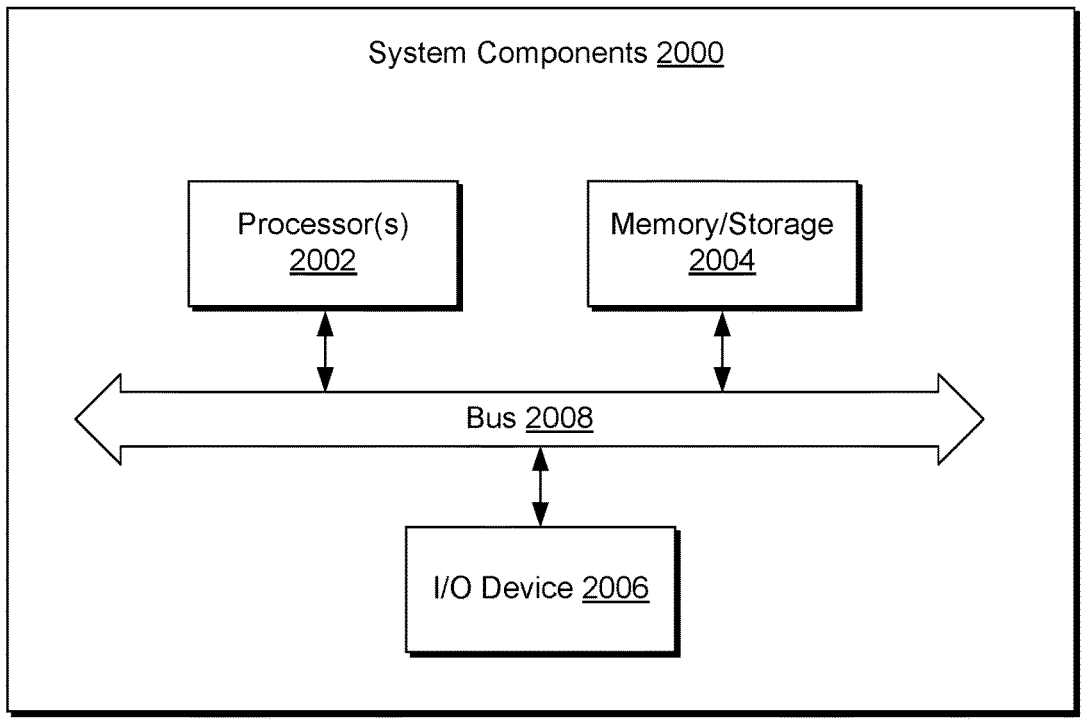
FIG. 20 illustrates example components of a system and a networked system.
Figure 20:
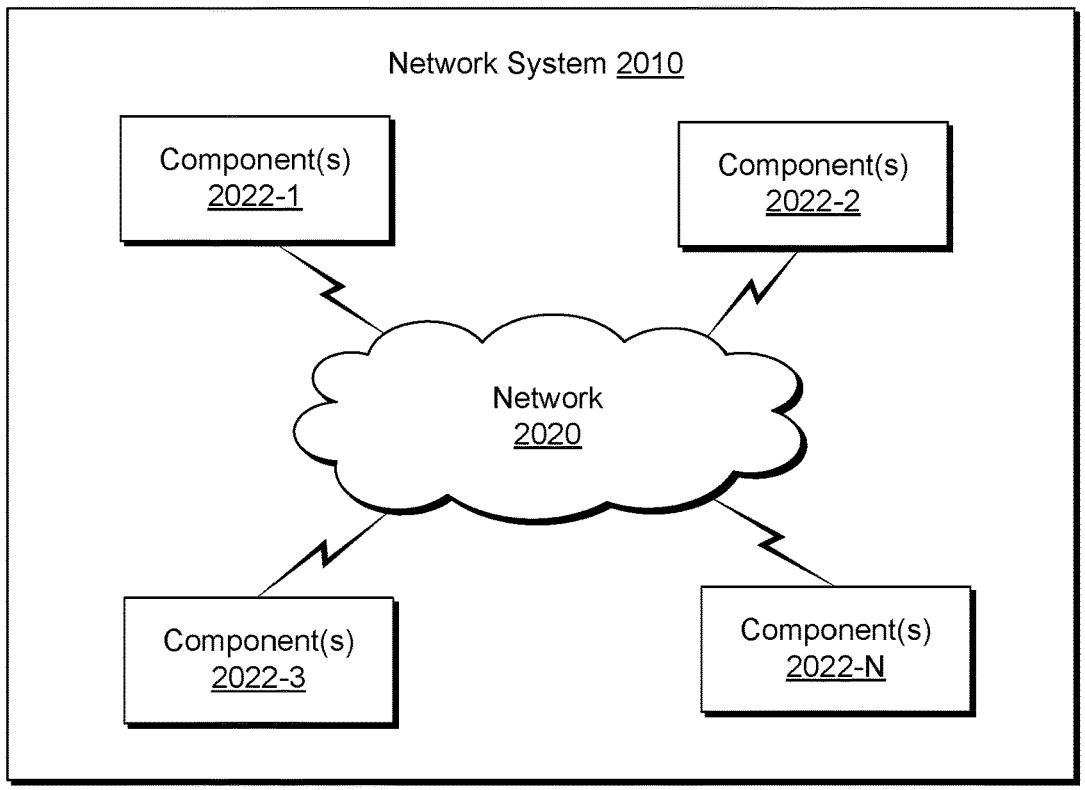

FIG. 20 shows components of a computing system 2000 and a networked system 2010. The system 2000 includes one or more processors 2002, memory and/or storage components 2004, one or more input and/or output devices 2006 and a bus 2008. According to an embodiment, instructions may be stored in one or more computer-readable media (e.g., memory/storage components 2004). Such instructions may be read by one or more processors (e.g., the processor(s) 2002) via a communication bus (e.g., the bus 2008), which may be wired or wireless. The one or more processors may execute such instructions to implement (wholly or in part) one or more attributes (e.g., as part of a method). A user may view output from and interact with a process via an I/O device (e.g., the device 2006). According to an embodiment, a computer-readable medium may be a storage component such as a physical memory storage device, for example, a chip, a chip on a package, a memory card, etc.

According to an embodiment, components may be distributed, such as in the network system 2010. The network system 2010 includes components 2022-1, 2022-2, 2022-3, . . . 2022-N. For example, the components 2022-1 may include the processor(s) 2002 while the component(s) 2022-3 may include memory accessible by the processor(s) 2002. Further, the component(s) 2022-2 may include an I/O device for display and optionally interaction with a method.

The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method for making nuclear magnetic resonance (NMR) measurements in a wellbore, the method comprising:
   (a) deploying a tool string in the wellbore, the tool string including an NMR logging tool and a conductivity or salinity measurement sensor, the NMR logging tool configured to make NMR measurements by transmitting a pulse train including a 90 degree pulse followed by a plurality of 180 degree pulses;
(b) using the conductivity or salinity measurement sensor to make a downhole measurement of a conductivity of a fluid in the wellbore or a salinity of the fluid in the wellbore;
(c) evaluating said conductivity or salinity measurement made in (b) to determine a new pulse width of the 90 degree pulse that improves a signal strength of an NMR signal;
(d) causing the NMR logging to make NMR logging measurements using the 90 degree pulse having the new pulse width determined in (c); and
(e) processing the NMR logging measurements made in (d) to characterize a subterranean formation.

2. The method of claim 1, wherein (c) further comprises inputting the conductivity or the salinity measurement made in (b), or an antenna quality factor determined from said conductivity or salinity measurement, into a model to determine the new pulse width of the 90 degree pulse.

3. The method of claim 2, wherein the model comprises a look-up table.

4. The method of claim 1 wherein said determining the new pulse width of the 90 degree pulse comprises accessing a model stored in memory of the downhole NMR tool wherein the model predicts trends in 90 degree pulse width values with respect to at least one of the conductivity, the salinity, or an antenna quality factor determined from the conductivity or the salinity measurement.

5. The method of claim 1, wherein:
(b) further comprises using a temperature sensor deployed in the tool string to measure a temperature of the fluid while the tool string is deployed in the wellbore in (a); and
(c) further comprises processing the conductivity or the salinity measurement and the temperature measurement made in (b) to determine the new pulse width of the 90 degree pulse while the NMR logging tool is deployed in the wellbore.

6. A downhole tool string comprising:
a nuclear magnetic resonance (NMR) logging tool including a permanent magnet configured to generate a static magnetic field and an antenna configured to generate a train of radio frequency pulses and measure echo responses, the train including a 90 degree pulse followed by a plurality of 180 degree pulses;
a conductivity measurement sensor configured to make a conductivity measurement of a wellbore fluid or a salinity measurement sensor configured to make a salinity measurement of the wellbore fluid; and
a processing unit including a processor, memory accessible by the processor, and processor-executable instructions stored in memory and executable by the processor, the instructions configured to:
(i) cause the conductivity or salinity measurement sensor to make a conductivity measurement of the wellbore fluid or a salinity measurement of the wellbore fluid;
(ii) evaluate said conductivity or salinity measurement made in (i) to determine a new pulse width of the 90 degree pulse that improves a signal strength of an NMR signal; and
(iii) cause the NMR logging tool to acquire NMR measurements using the new pulse width.

7. The tool string of claim 6, further comprising a temperature sensor, wherein the instructions are further configured to cause the temperature sensor to measure a temperature of the wellbore fluid in (i) and evaluate said conductivity or salinity measurement and said temperature measurement made in (i) to determine the new pulse width of the 90 degree pulse in (ii).

8. The tool string of claim 6, wherein (ii) further comprises inputting said conductivity or salinity measurement, or an antenna quality factor determined from said conductivity or salinity measurement, into a model to determine the new pulse width of the 90 degree pulse.

9. The tool string of claim 8, wherein the model comprises a look-up table stored in the memory.

10. The tool string of claim 6, wherein the processing unit and the memory are deployed in the NMR logging tool.

11. The tool string of claim 6, wherein the conductivity measurement sensor or the salinity measurement sensor, the processing unit, and the memory are deployed in the NMR logging tool.

* * * * *